(12) United States Patent
Toyota et al.

(10) Patent No.: US 12,199,066 B2
(45) Date of Patent: Jan. 14, 2025

(54) SEMICONDUCTOR DEVICE AND METHOD FOR PRODUCING THE SAME

(71) Applicant: Kioxia Corporation, Tokyo (JP)

(72) Inventors: Gen Toyota, Yokkaichi (JP); Satoshi Hongo, Yokkaichi (JP); Tatsuo Migita, Nagoya (JP); Susumu Yamamoto, Yokkaichi (JP); Tsutomu Fujita, Yokkaichi (JP); Eiichi Shin, Yokkaichi (JP); Yukio Katamura, Mie (JP); Hideki Matsushige, Yokkaichi (JP); Kazuki Takahashi, Mie (JP)

(73) Assignee: Kioxia Corporation, Tokyo (JP)

( * ) Notice: Subject to any disclaimer, the term of this patent is extended or adjusted under 35 U.S.C. 154(b) by 404 days.

(21) Appl. No.: 17/694,080

(22) Filed: Mar. 14, 2022

(65) Prior Publication Data

US 2023/0101002 A1 Mar. 30, 2023

(30) Foreign Application Priority Data

Sep. 22, 2021 (JP) ................................ 2021-154227

(51) Int. Cl.
*H01L 25/065* (2023.01)
*H01L 21/56* (2006.01)
*H01L 23/00* (2006.01)
*H01L 23/31* (2006.01)
*H01L 23/48* (2006.01)

(52) U.S. Cl.
CPC ........ *H01L 25/0652* (2013.01); *H01L 21/565* (2013.01); *H01L 23/3135* (2013.01); *H01L 23/3157* (2013.01); *H01L 23/3171* (2013.01); *H01L 23/3192* (2013.01); *H01L 23/481* (2013.01); *H01L 24/08* (2013.01); *H01L 24/80* (2013.01); *H01L 25/0657* (2013.01); *H01L 2224/08146* (2013.01); *H01L 2224/08147* (2013.01); *H01L 2224/08237* (2013.01); *H01L 2224/80895* (2013.01); *H01L 2224/80896* (2013.01); *H01L 2225/0652* (2013.01); *H01L 2225/06544* (2013.01); *H01L 2225/06548* (2013.01); *H01L 2924/1431* (2013.01); *H01L 2924/1434* (2013.01);

(Continued)

(58) Field of Classification Search
CPC ............ H01L 23/3135; H01L 23/3157; H01L 23/3171; H01L 23/3192
See application file for complete search history.

(56) References Cited

U.S. PATENT DOCUMENTS 7,413,925 B2 * 8/2008 Egawa ................ H01L 25/0657
257/E21.705
7,638,362 B2 * 12/2009 Ishino ..................... H01L 25/18
257/737

(Continued)

FOREIGN PATENT DOCUMENTS

JP 03-190129 A 8/1991
JP 2009-158764 A 7/2009

(Continued)

*Primary Examiner* — David A Zarneke
(74) *Attorney, Agent, or Firm* — Oblon, McClelland, Maier & Neustadt, L.L.P.

(57) ABSTRACT

A semiconductor device including a base substrate B, which includes wire layers, chips C1, C2, C3, C4, C5, and C6 provided on the base substrate B, and a protective film P provided on each of the side faces of the chips C1, C2, C3, C4, C5, and C6.

6 Claims, 31 Drawing Sheets

(52) U.S. Cl.
CPC ............... *H01L 2924/1811* (2013.01); *H01L 2924/1815* (2013.01); *H01L 2924/182* (2013.01)

(56) References Cited

U.S. PATENT DOCUMENTS

| | | | |
|---|---|---|---|
| 7,906,363 B2 | 3/2011 | Koyanagi | |
| 8,274,143 B2* | 9/2012 | Fujishima | H01L 24/97 257/621 |
| 8,304,877 B2* | 11/2012 | Fujii | H01L 23/3135 257/E23.011 |
| 8,310,382 B2* | 11/2012 | Ide | G11C 5/02 341/100 |
| 8,373,278 B2* | 2/2013 | Shinogi | H01L 23/3128 257/777 |
| 8,377,745 B2* | 2/2013 | Shimada | H01L 25/50 438/109 |
| 8,497,576 B2* | 7/2013 | Fujii | H01L 23/3135 257/686 |
| 8,535,977 B2 | 9/2013 | Abe | |
| 8,575,763 B2* | 11/2013 | Yoshida | H01L 24/81 257/E23.129 |
| 8,653,676 B2* | 2/2014 | Kim | H01L 24/19 257/790 |
| 8,710,653 B2* | 4/2014 | Fukuda | H01L 25/0657 257/788 |
| 9,099,443 B2 | 8/2015 | Tsumura | |
| 9,165,916 B2* | 10/2015 | Chung | H01L 23/295 |
| 9,171,825 B2* | 10/2015 | Park | H01L 25/50 |
| 9,466,546 B2* | 10/2016 | Hatakeyama | H01L 23/3135 |
| 9,508,704 B2* | 11/2016 | Chung | H01L 25/105 |
| 10,014,285 B2* | 7/2018 | Kim | H01L 25/0657 |
| 10,128,153 B2* | 11/2018 | Tajima | H01L 24/97 |
| 10,658,332 B2* | 5/2020 | Sung | H01L 24/17 |
| 10,923,438 B2* | 2/2021 | Tsai | H01L 23/562 |
| 11,404,395 B2* | 8/2022 | Hwang | H01L 25/50 |
| 11,894,346 B2* | 2/2024 | Hwang | H01L 25/105 |
| 11,935,868 B2* | 3/2024 | Lee | H01L 24/73 |
| 2008/0128916 A1* | 6/2008 | Soejima | H01L 23/66 257/E23.126 |
| 2010/0314749 A1 | 12/2010 | Kurita | |
| 2015/0008593 A1 | 1/2015 | Takemoto et al. | |
| 2015/0069634 A1* | 3/2015 | Oyama | H01L 23/562 257/777 |
| 2016/0079222 A1* | 3/2016 | Sato | H01L 24/05 438/109 |
| 2017/0047310 A1* | 2/2017 | Shim | H01L 21/568 |
| 2017/0243857 A1* | 8/2017 | Hwang | H01L 25/0655 |
| 2020/0273846 A1* | 8/2020 | Kitada | H01L 23/3135 |
| 2020/0381315 A1 | 12/2020 | Kawai et al. | |
| 2022/0189839 A1* | 6/2022 | Eid | H01L 21/56 |
| 2023/0065248 A1* | 3/2023 | Zhou | H01L 21/561 |
| 2023/0072616 A1* | 3/2023 | Yoon | H01L 23/562 |
| 2024/0203901 A1* | 6/2024 | Ohda | H01L 23/3121 |

FOREIGN PATENT DOCUMENTS

| | | |
|---|---|---|
| JP | 2009-170514 A | 7/2009 |
| JP | 2010-103195 A | 5/2010 |
| JP | 2013-179373 A | 9/2013 |
| JP | 2013-201224 A | 10/2013 |
| JP | 2020-194936 A | 12/2020 |
| WO | WO2006/080337 A1 | 8/2006 |
| WO | WO2013/141091 A1 | 9/2013 |

* cited by examiner

FIG.22
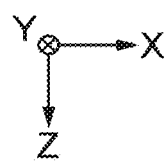

FIG.23
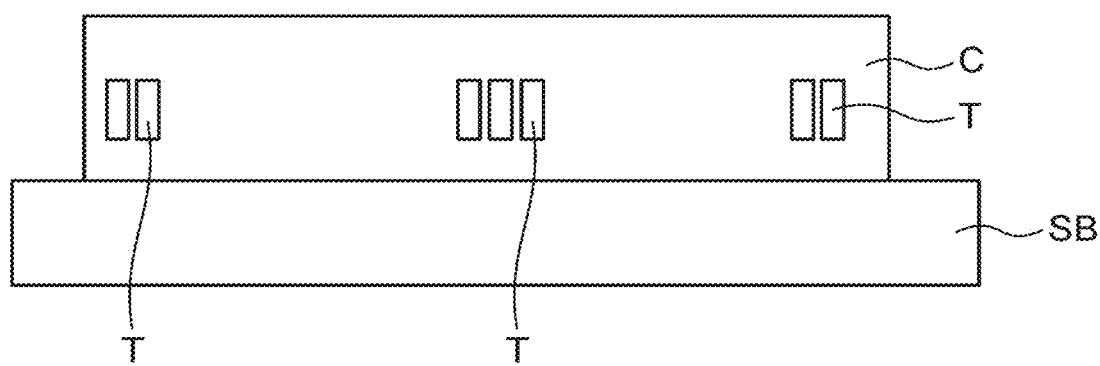
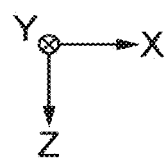

FIG.24
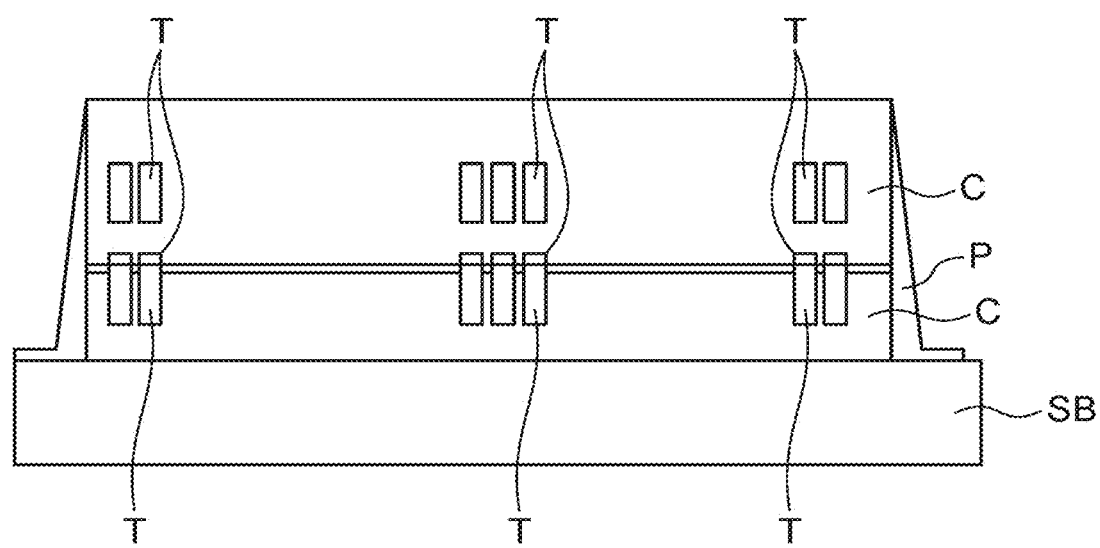
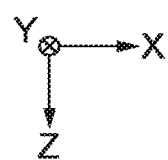

FIG.26
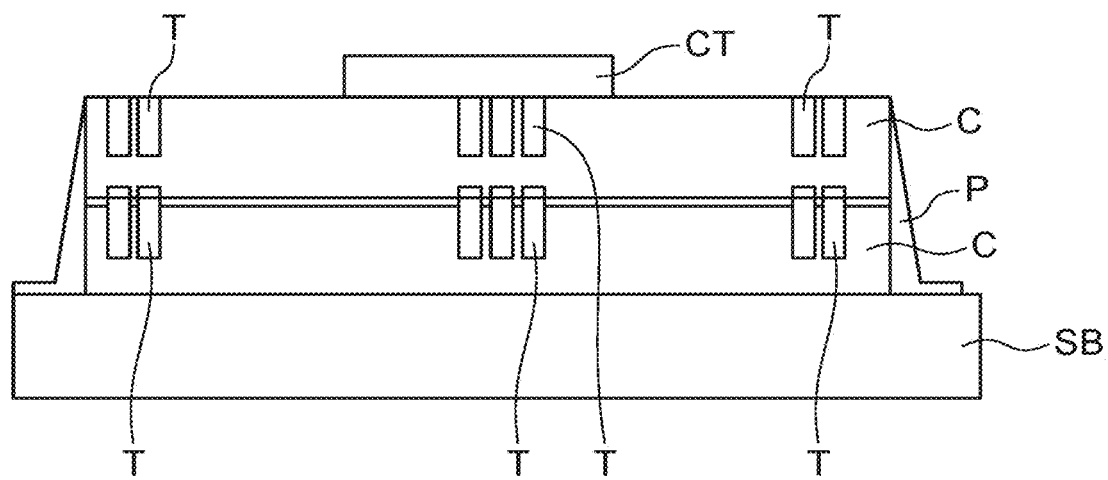
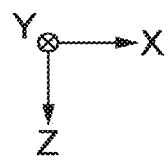

SEMICONDUCTOR DEVICE AND METHOD FOR PRODUCING THE SAME

CROSS-REFERENCE TO RELATED APPLICATION

This application is based upon and claims the benefit of priority from Japanese Patent Application No. 2021-154227, filed on Sep. 22, 2021, the entire contents of which are incorporated herein by reference.

BACKGROUND OF THE INVENTION

Field of the Invention

Embodiments of the present invention relate to a semiconductor device and a method for producing the same.

Description of the Related Art

As an example of a semiconductor device and a method for producing the same, a stacked device chip and a method for producing the same are known.

BRIEF DESCRIPTION OF THE DRAWINGS

FIG. 22 is a view for illustrating a method for producing the semiconductor memory device illustrated in FIG. 21;

FIG. 23 is a view for illustrating a method for illustrating the semiconductor memory device illustrated in FIG. 21;

FIG. 24 is a view for illustrating a method for producing the semiconductor memory device illustrated in FIG. 21;

FIG. 26 is a view for illustrating a method for producing the semiconductor memory device illustrated in FIG. 21;

DETAILED DESCRIPTION OF THE PREFERRED EMBODIMENTS

Hereinafter, the present embodiment will be described with reference to the accompanying drawings. For easy understanding of the description, components that are the same throughout the drawings are denoted by the same reference signs as much as possible, and repeated description will be omitted.

Figure 1:
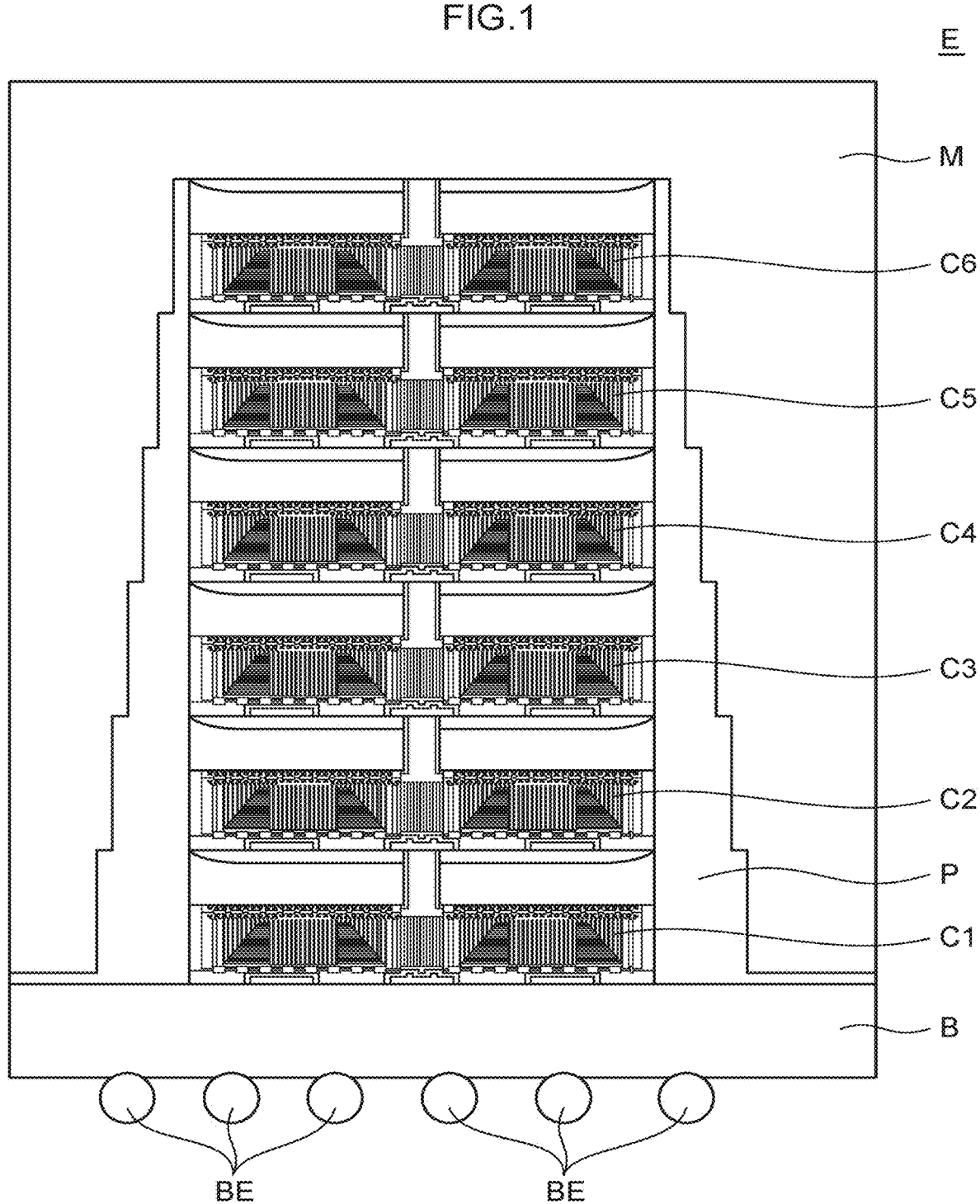
FIG. 1 is a view for illustrating the configuration of a semiconductor memory device according to a first embodiment.

FIG. 1 is a cross-sectional view for illustrating the structure of a semiconductor memory device E according to a first embodiment. The semiconductor memory device E includes a base substrate B and chips C1, C2, C3, C4, C5, and C6. The chip C1 is joined to the base substrate B. A plurality of metal balls BE are joined to a face of the base substrate B on the side opposite to the face to which the chip C1 is joined. The chip C2 is joined to a face of the chip C1 on the side opposite to the face joined to the base substrate B. The chip C3 is joined to a face of the chip C2 on the side opposite to the face joined to the chip C1. The chip C4 is joined to a face of the chip C3 on the side opposite to the face joined to the chip C2. The chip C5 is joined to a face of the chip C4 on the side opposite to the face joined to the chip C3. The chip C6 is joined to a face of the chip C5 on the side opposite to the face joined to the chip C4. In this manner, the chips C1, C2, C3, C4, C5, and C6 are stacked on the base substrate B.

A protective film P is provided so as to cover the side faces of the chips C1, C2, C3, C4, C5, and C6. The protective film P also at least partially covers the base substrate B. In the present embodiment, as an example, the protective film P is provided such that it is relatively thick on the side of the chip C1 and is relatively thin on the side of the chip C6. The thickness of the protective film P is not limited thereto, and for example, the protective film P with a uniform thickness may be provided. The protective film P may also be provided such that it is relatively thick on the side of the chip C6 and is relatively thin on the side of the chip C1. The protective film P may also be removed. A molding resin layer M is provided so as to cover the protective film P.

Next, a method for producing the semiconductor memory device E will be described with reference to FIGS. 2 to 11. Although FIGS. 2 to 11 illustrate the production of two semiconductor memory devices E, it is also possible to concurrently produce a number of, that is, three or more semiconductor memory devices E.

Figure 2:
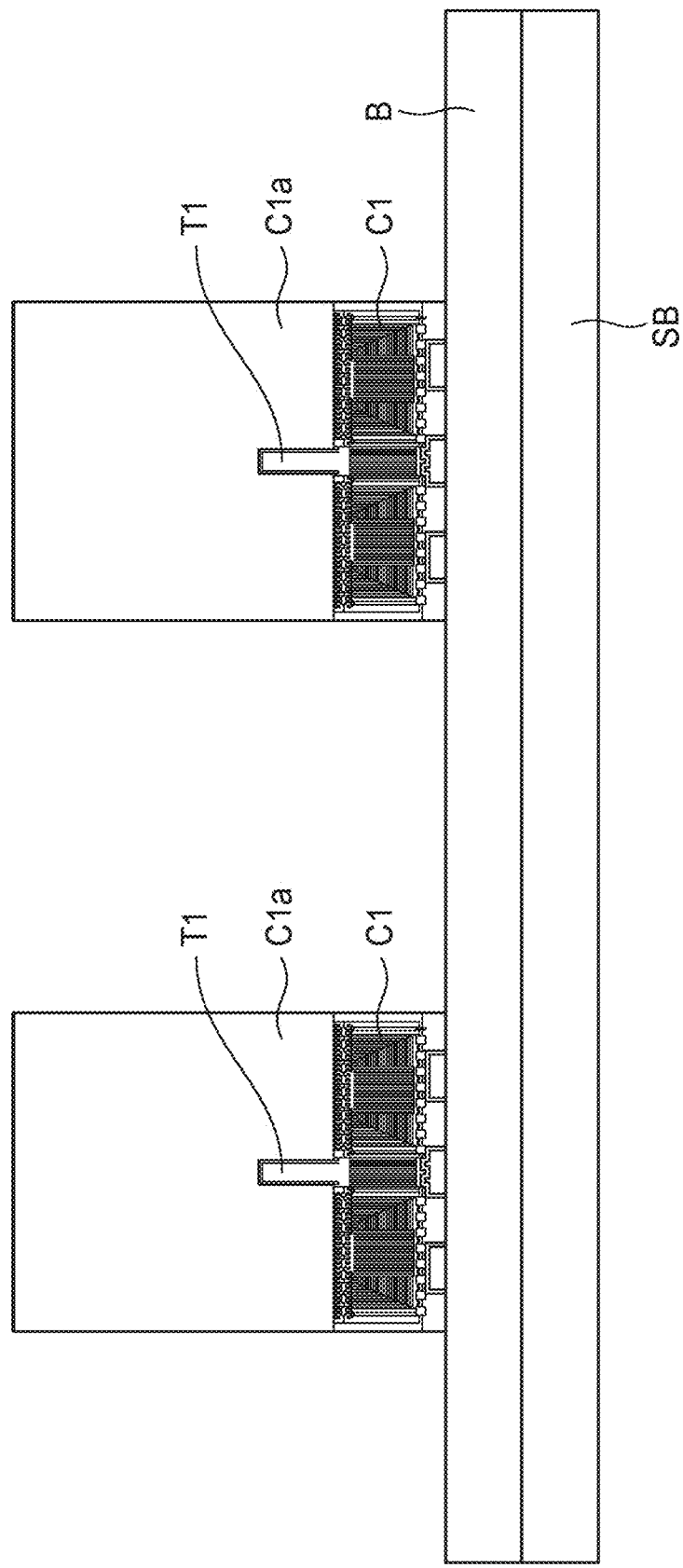
FIG. 2 is a view for illustrating a method for producing the semiconductor memory device illustrated in FIG. 1.

As illustrated in FIG. 2, the base substrate B bonded to a support substrate SB is prepared. It should be noted that the base substrate B may also be obtained by forming wire layers on the support substrate SB. A predetermined number of chips C1 obtained through dicing are bonded to the base substrate B at predetermined positions. Silicon C1a on each chip C1 is thick. A through-silicon via (TSV) T1 extending from each chip C1 is buried in the silicon C1a.

Figure 3:
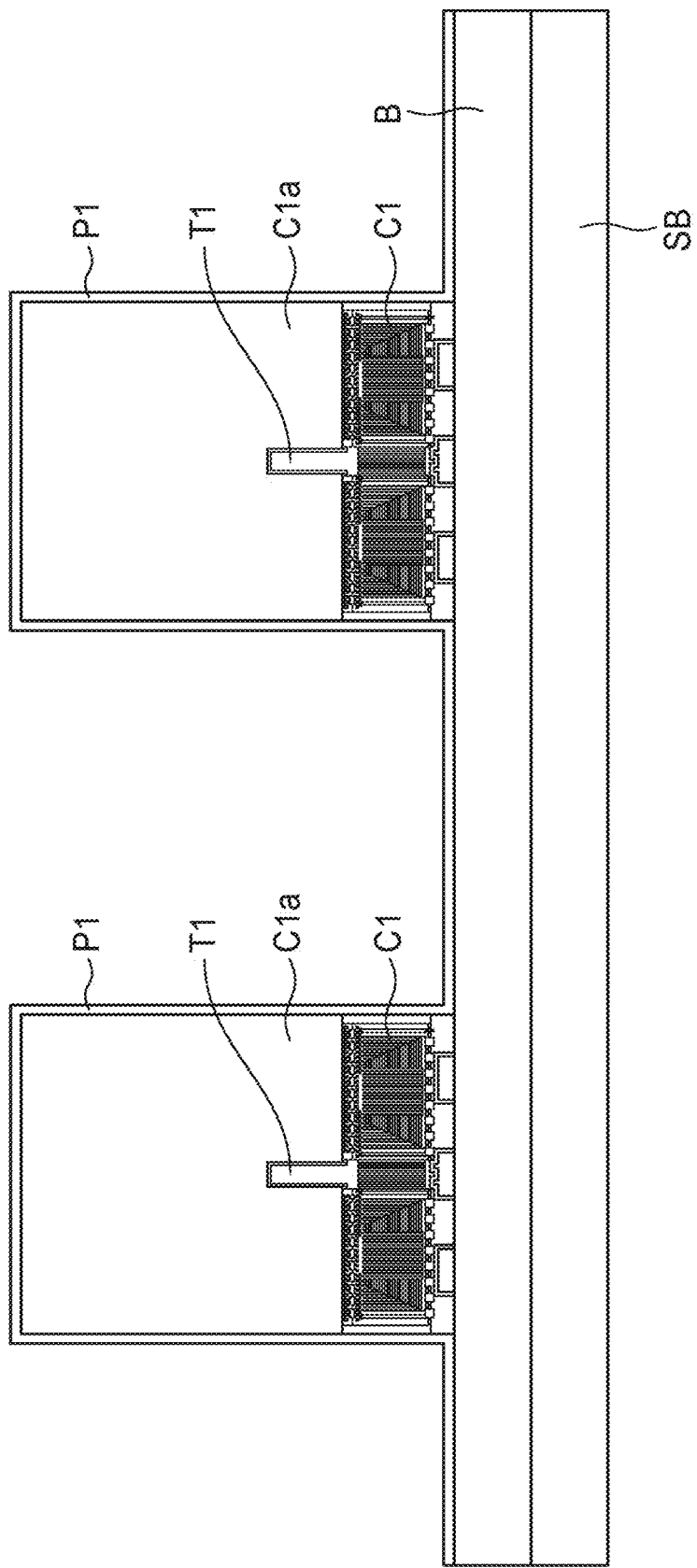
FIG. 3 is a view for illustrating a method for producing the semiconductor memory device illustrated in FIG. 1.

Next, as illustrated in FIG. 3, a protective film P1 is formed so as to cover each chip C1, the silicon C1a, and the base substrate B. The protective film P1 is a film with high mechanical strength. For example, a film of $SiO_2$, SiN, SiC, or BN is used as the protective film P1. Besides, a variety of inorganic insulating films, such as DLC (diamond-like carbon), may be used, for example.

Figure 4:
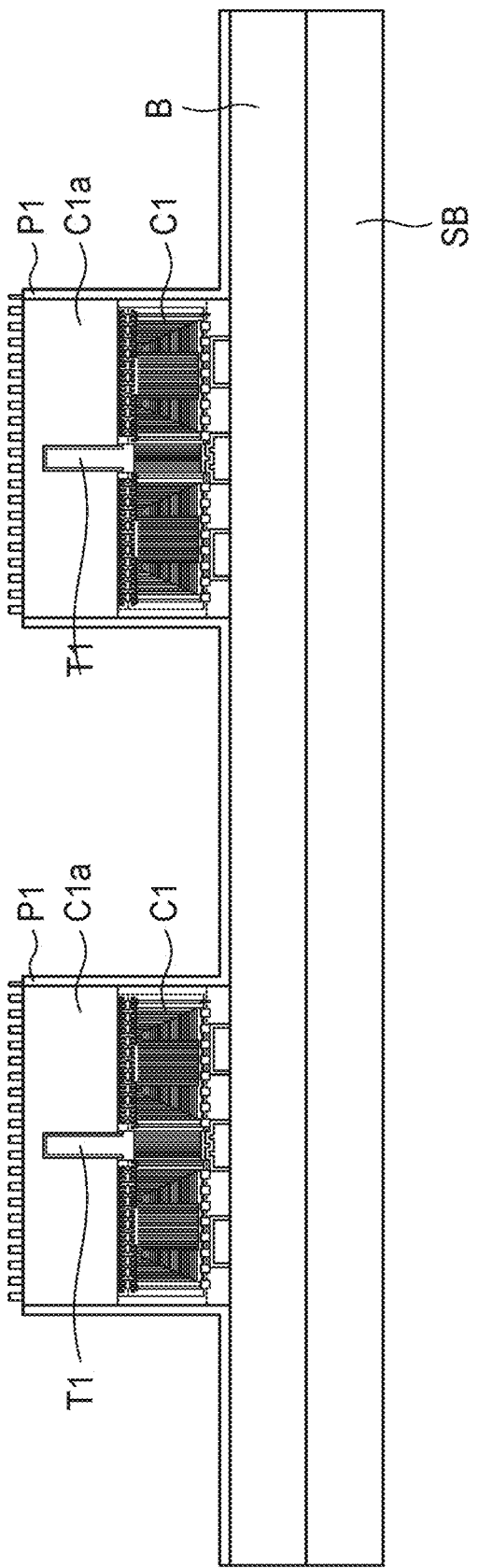
FIG. 4 is a view for illustrating a method for producing the semiconductor memory device illustrated in FIG. 1.

Next, as illustrated in FIG. 4, the silicon C1a is ground with a backside grinder. The silicon C1a ground with the backside grinder has a high surface roughness.

Figure 5:
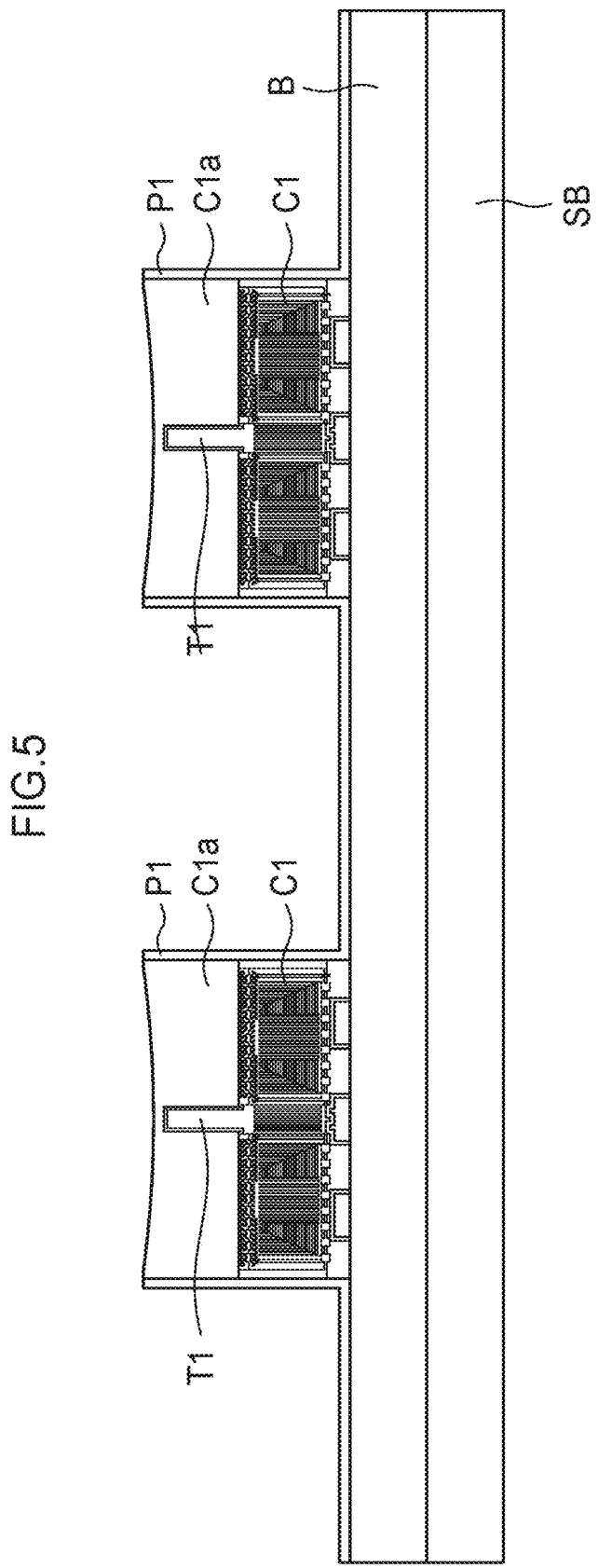
FIG. 5 is a view for illustrating a method for producing the semiconductor memory device illustrated in FIG. 1.

Next, as illustrated in FIG. 5, the silicon C1a is made thinner by CMP (Chemical Mechanical Polishing). Through CMP, crystal defects are removed and the surface roughness is improved. The protective film P1 is not easily removed through CMP, and thus, the silicon C1a is removed more than the protective film P1.

Figure 6:
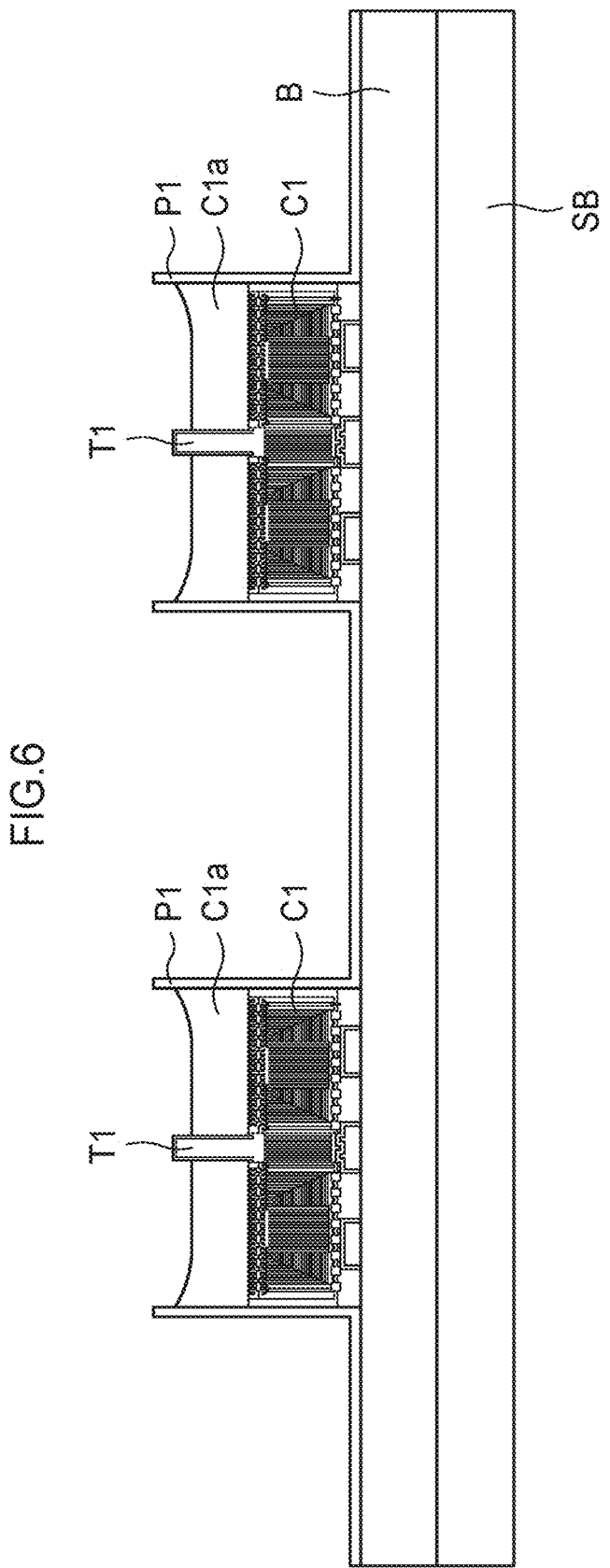
FIG. 6 is a view for illustrating a method for producing the semiconductor memory device illustrated in FIG. 1.
Figure 7:
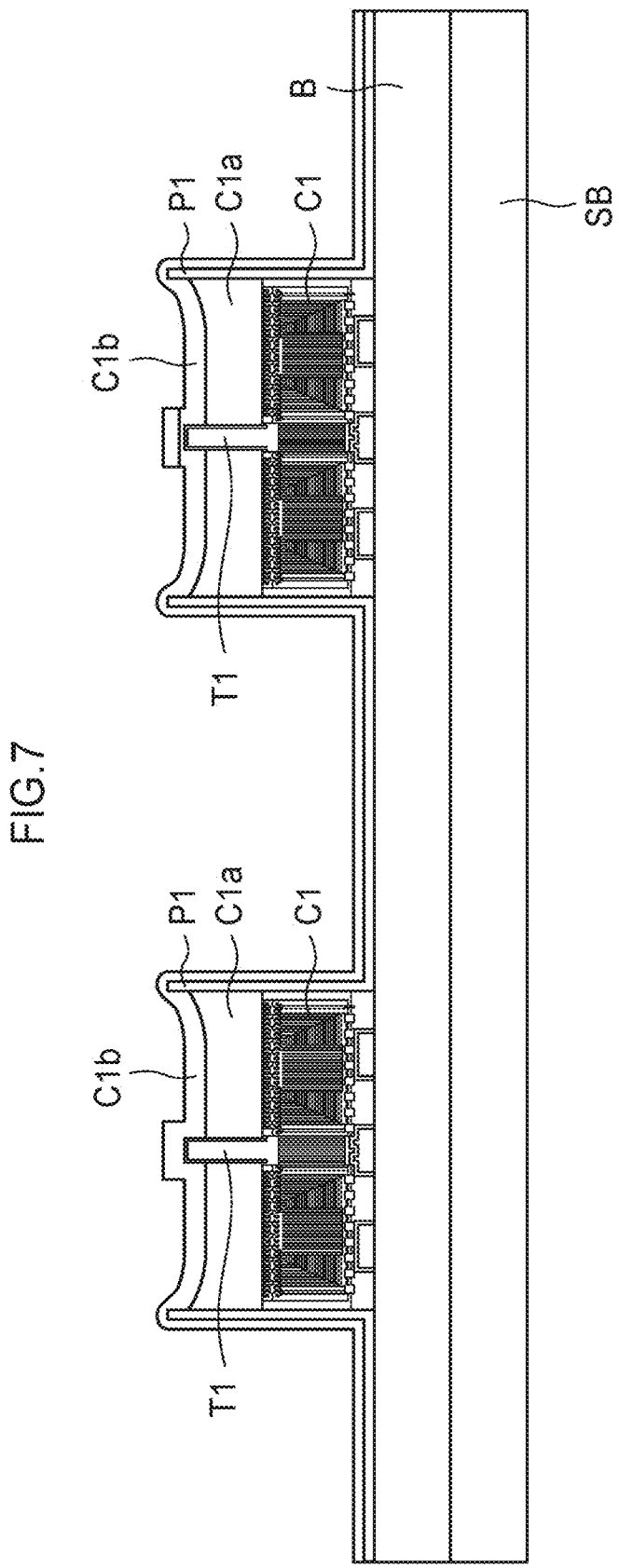
FIG. 7 is a view for illustrating a method for producing the semiconductor memory device illustrated in FIG. 1.

Next, as illustrated in FIG. 6, dry etching is performed on the silicon C1a to expose the top portion of the through-silicon via T1. Next, as illustrated in FIG. 7, an oxide film C1b to serve as a bonding face is formed conformally. As the oxide film C1b, a $SiO_2$ film is used, for example.

Figure 8:
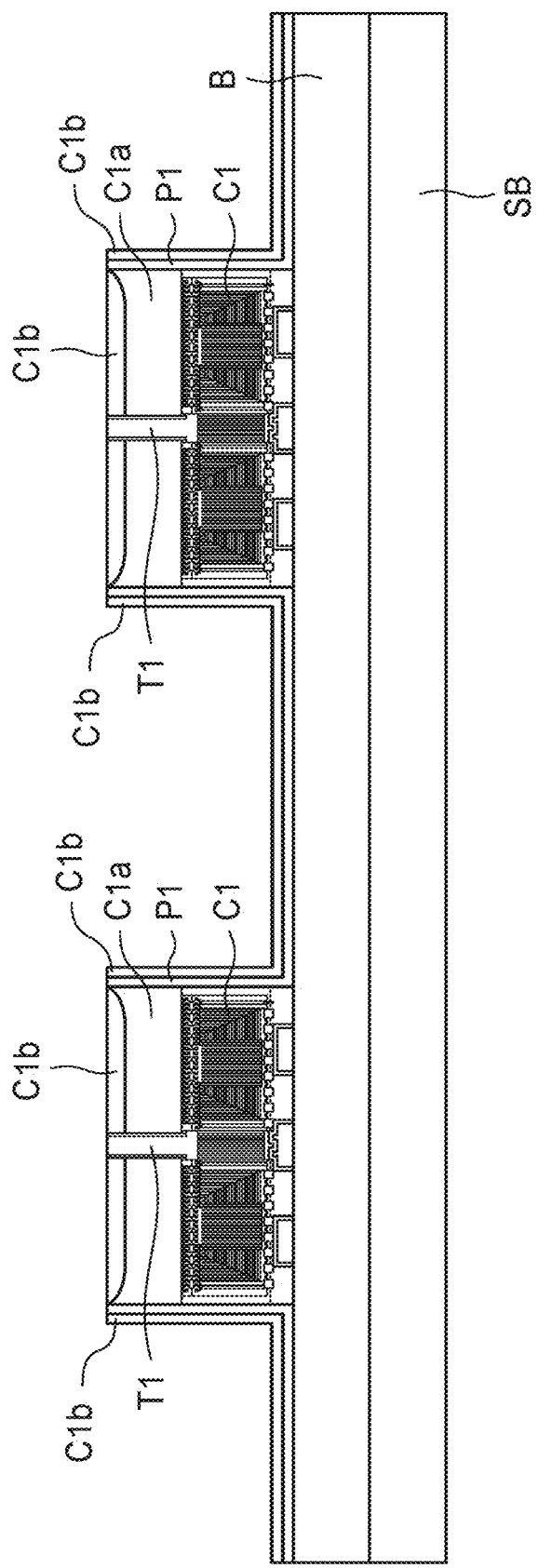
FIG. 8 is a view for illustrating a method for producing the semiconductor memory device illustrated in FIG. 1.

Next, as illustrated in FIG. 8, the protective film P1, the oxide film C1b, and the through-silicon via T1 are made thinner by CMP so that a flat bonding face is formed. The oxide film C1b formed on each side face of each chip C1 at this time is referred to as a first oxide film, and the oxide film C1b formed on the rear face of each chip C1 at this time is referred to as a second oxide film. The second oxide film is thinner around the peripheral edge portions of each chip C1 than around the central portion of the chip C1. The upper end portion of the protective film P1 on each side face of each chip C1 is located between the first oxide film and the second oxide film, and further, the upper end portion of the protective film P1 is exposed from the first oxide film and the second oxide film.

Figure 9:
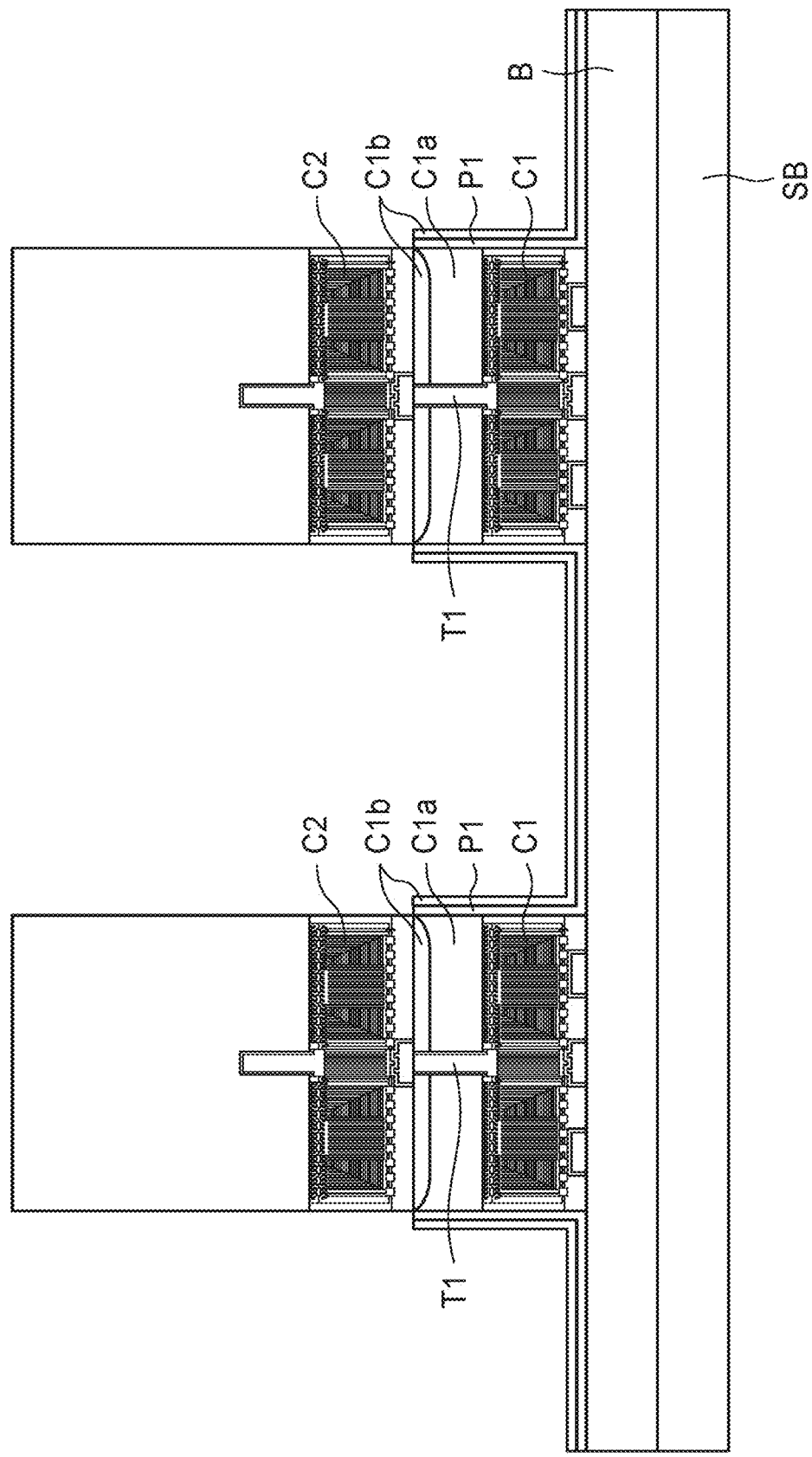
FIG. 9 is a view for illustrating a method for producing the semiconductor memory device illustrated in FIG. 1.

Next, as illustrated in FIG. 9, a next chip C2 is bonded to the bonding face of each chip C1.

A process performed on the chip C2 is similar to that performed on the chip C1. That is, a protective film P2 is formed on the chip C2. The protective film P2 is formed on the rear face and the side faces of the chip C2 and also on the side faces of the chip C1. If the protective film P1 and the oxide film C1b remain on each side face of the chip C1, the protective film P2 is formed thereon. Then, the chip C2 is made thinner from the side of its rear face so that the top portion of the through-silicon via is exposed.

Then, an oxide film C2b to serve as a bonding face is formed on the rear face of the chip C2. The oxide film C2b is also formed on the side faces of the chip C2 and on the side faces of the chip C1. At this time, the oxide film C2b may also be formed on the protective film P2.

Figure 10:
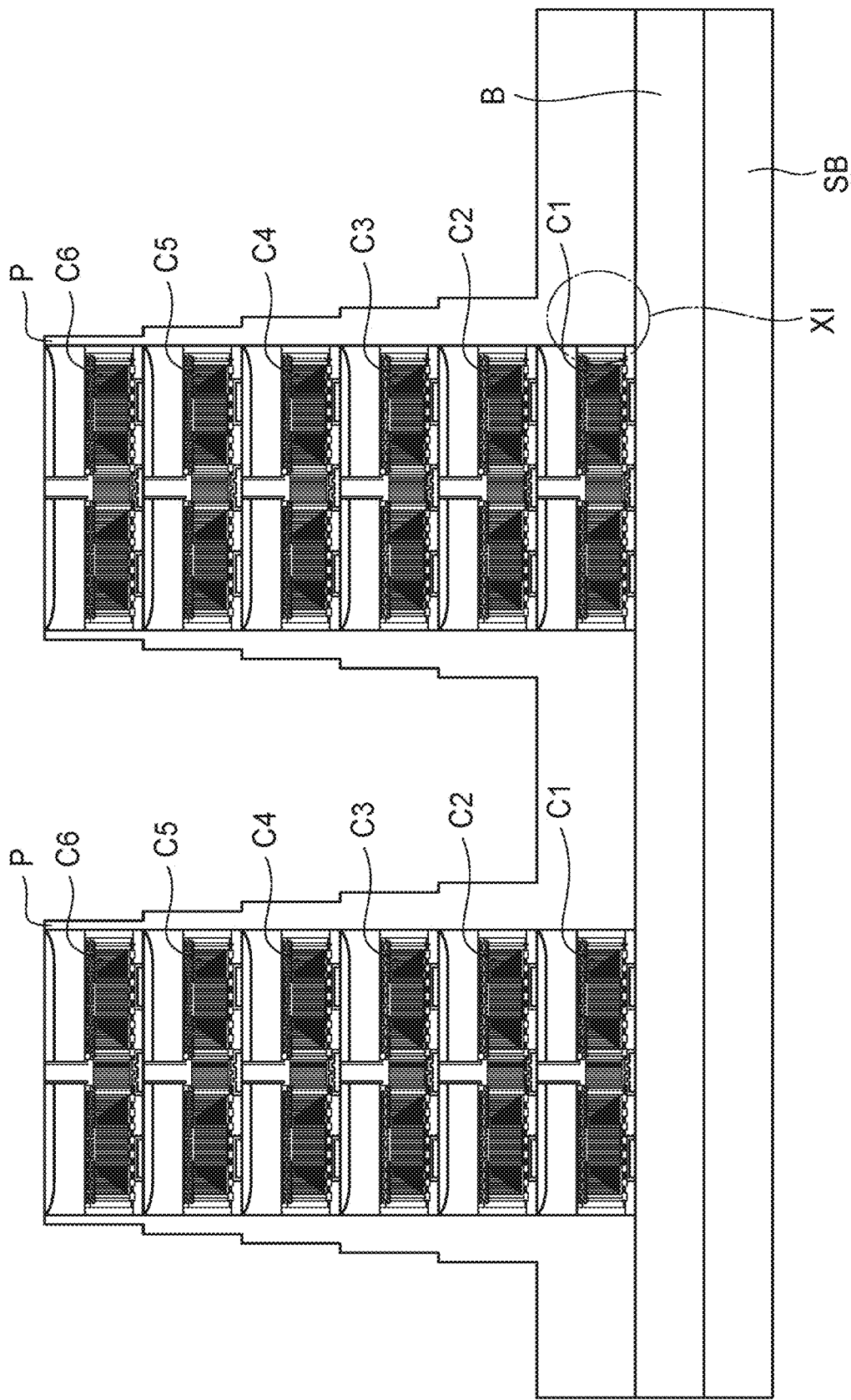
FIG. 10 is a view for illustrating a method for producing the semiconductor memory device illustrated in FIG. 1.

Then, the protective film, the oxide film, and the through-silicon via are made thinner by CMP so that a flat face is formed. Hereinafter, the procedures described with reference to FIGS. 3 to 8 are repeated to stack the chips C3, C4, C5, and C6 and thus form a chip stack. As illustrated in FIG. 10, a protective film is formed each time a chip is stacked. Thus, the resulting protective film P after the chip C6 is stacked is thicker on each side face of the chip C1 than on each side face of the chip C6.

Figure 11:
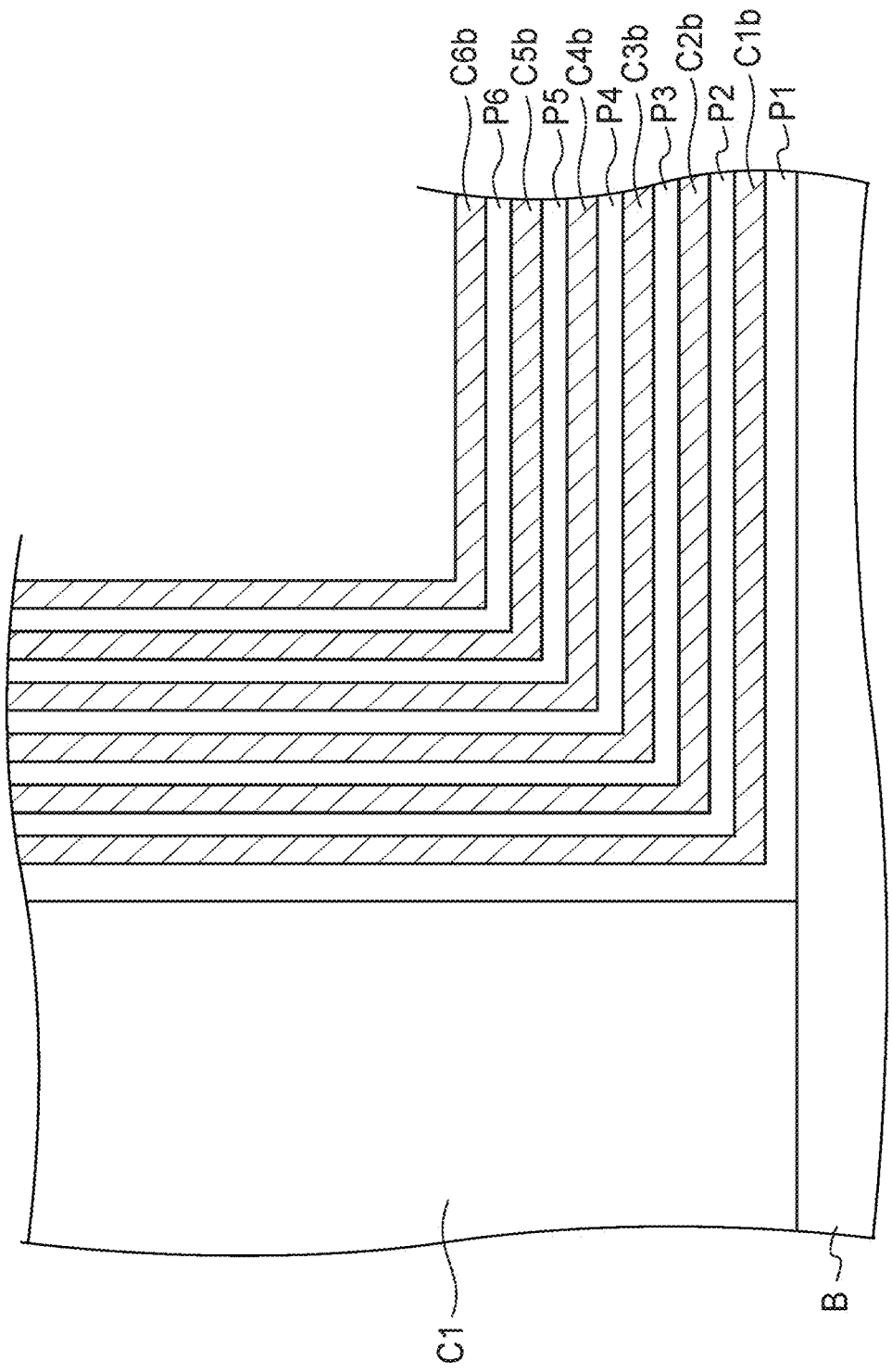
FIG. 11 is an enlarged view of an XI portion in FIG. 10.

FIG. 11 is an enlarged view of an XI portion in FIG. 10. As illustrated in FIG. 11, the protective film P1, the oxide film C1b, the protective film P2, the oxide film C2b, a protective film P3, an oxide film C3b, a protective film P4, an oxide film C4b, a protective film P5, an oxide film C5b, a protective film P6, and an oxide film C6b are stacked in this order. The protective film P1 and the oxide film C1b are a stacked film formed in providing the chip C1 as described above. The protective film P2 and the oxide film C2b are a stacked film formed in providing the chip C2 on the chip C1. The protective film P3 and the oxide film C3b are a stacked film formed in providing the chip C3 on the chip C2. The protective film P4 and the oxide film C4b are a stacked film formed in providing the chip C4 on the chip C3. The protective film P5 and the oxide film C5b are a stacked film formed in providing the chip C5 on the chip C4. The protective film P6 and the oxide film C6b are a stacked film formed in providing the chip C6 on the chip C5.

Six stacked films each including a stack of a protective film and an oxide film are provided on each side face of the chip C1 as illustrated in FIG. 11. Likewise, six stacked films each including a stack of a protective film and an oxide film are also provided on the base substrate B.

On each side face of the chip C2, neither the protective film P1 nor the oxide film C1b is formed, but the protective film P2 and the oxide film C2b are stacked first. Thus, five stacked films each including a stack of a protective film and an oxide film are provided. On each side face of the chip C3, neither the protective film P2 nor the oxide film C2b is formed besides the protective film P1 and the oxide film C1b, but the protective film P3 and the oxide film C3b are stacked first. Thus, four stacked films each including a stack of a protective film and an oxide film are provided.

On each side face of the chip C4, none of the protective films P1, P2, and P3 or none of the oxide films C1b, C2b, and C3b is formed, but the protective film P4 and the oxide film C4b are stacked first. Thus, three stacked films each including a stack of a protective film and an oxide film are provided. On each side face of the chip C5, none of the protective films P1, P2, P3, and P4 or none of the oxide films C1b, C2b, C3b, and C4b is formed, but the protective film P5 and the oxide film C5b are stacked first. Thus, two stacked films each including a stack of a protective film and an oxide film are provided. On each side face of the chip C6, none of the protective films P1, P2, P3, P4, and P5 or none of the oxide films C1b, C2b, C3b, C4b, and C5b is formed, but the protective film P6 and the oxide film C6b are stacked first. Thus, a single stacked film including a stack of a protective film and an oxide film is provided.

At this time, the chip C6, which is the uppermost layer, has nothing to which the through-silicon via T1 is connected. Thus, there may be a case where the chip C6 need not be made thinner. In such a case, a stacked film is not provided on each side face of the chip C6. Thus, the protective film P6 and the oxide film C6b illustrated in FIG. 11 are not formed. That is, on each side face of the chip C1, five stacked films each including a stack of a protective film and an oxide film are provided. In such a case, five stacked films each including a stack of a protective film and an oxide film are provided on the base substrate B.

Figure 12:
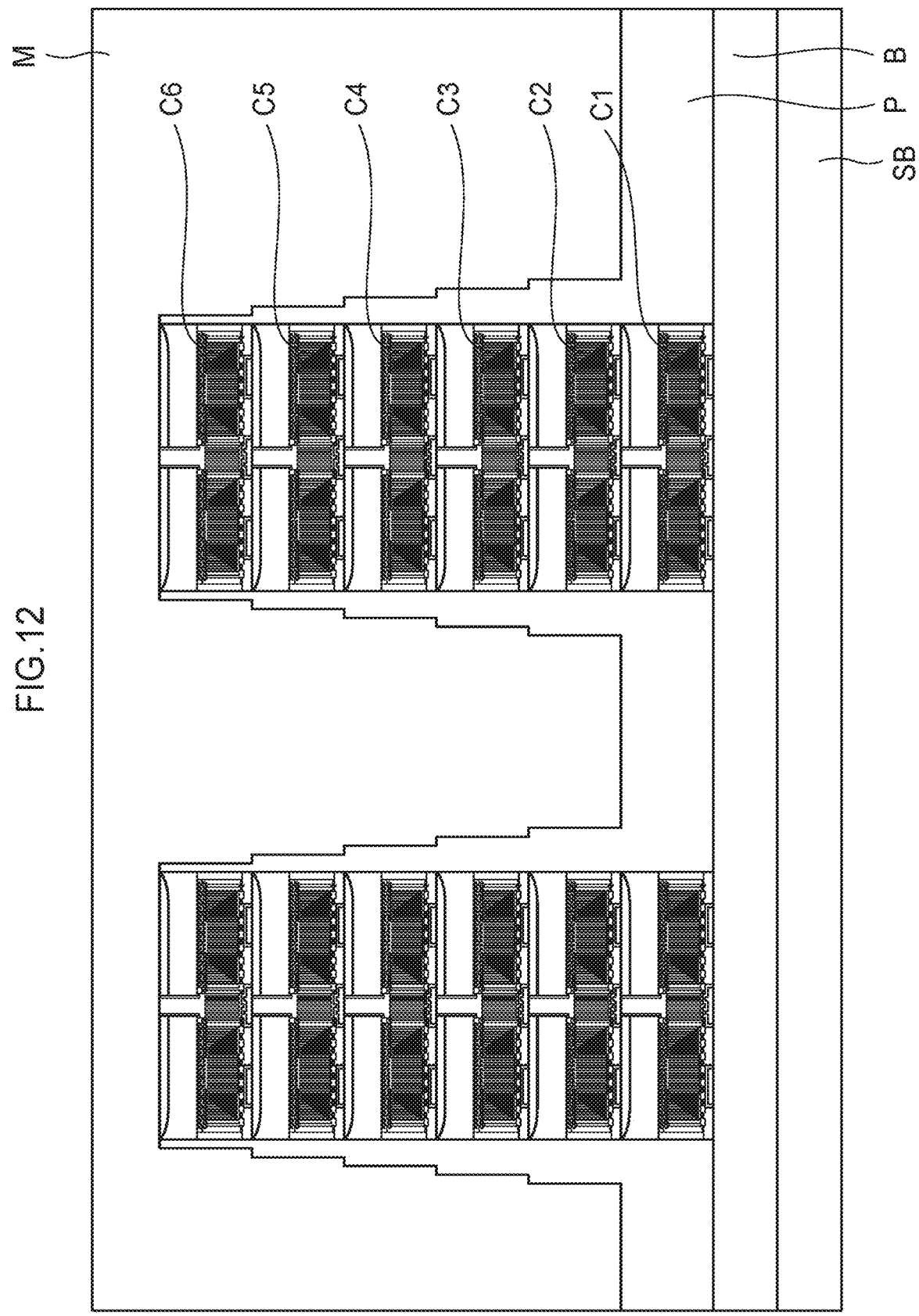
FIG. 12 is a view for illustrating a method for producing the semiconductor memory device illustrated in FIG. 1.

Next, as illustrated in FIG. 12, a molding resin layer M is formed. Then, the support substrate SB is removed and the structure is diced into individual pieces so that the semiconductor memory device E illustrated in FIG. 1 is obtained. The protective film P is partially exposed from the side faces of the molding resin M. The exposed protective film P is a stacked film of SiN and $SiO_2$ alternately repeated a plurality of times along the direction perpendicular to the surface of the base substrate B. The number of the repeated stacks may be the same as the number of the stacked chips or smaller than that by one. The protective film P on the base substrate B may be removed before the molding resin layer M is formed. In such a case, the protective film P is not exposed from the side faces of the molding resin layer M.

Figure 13:
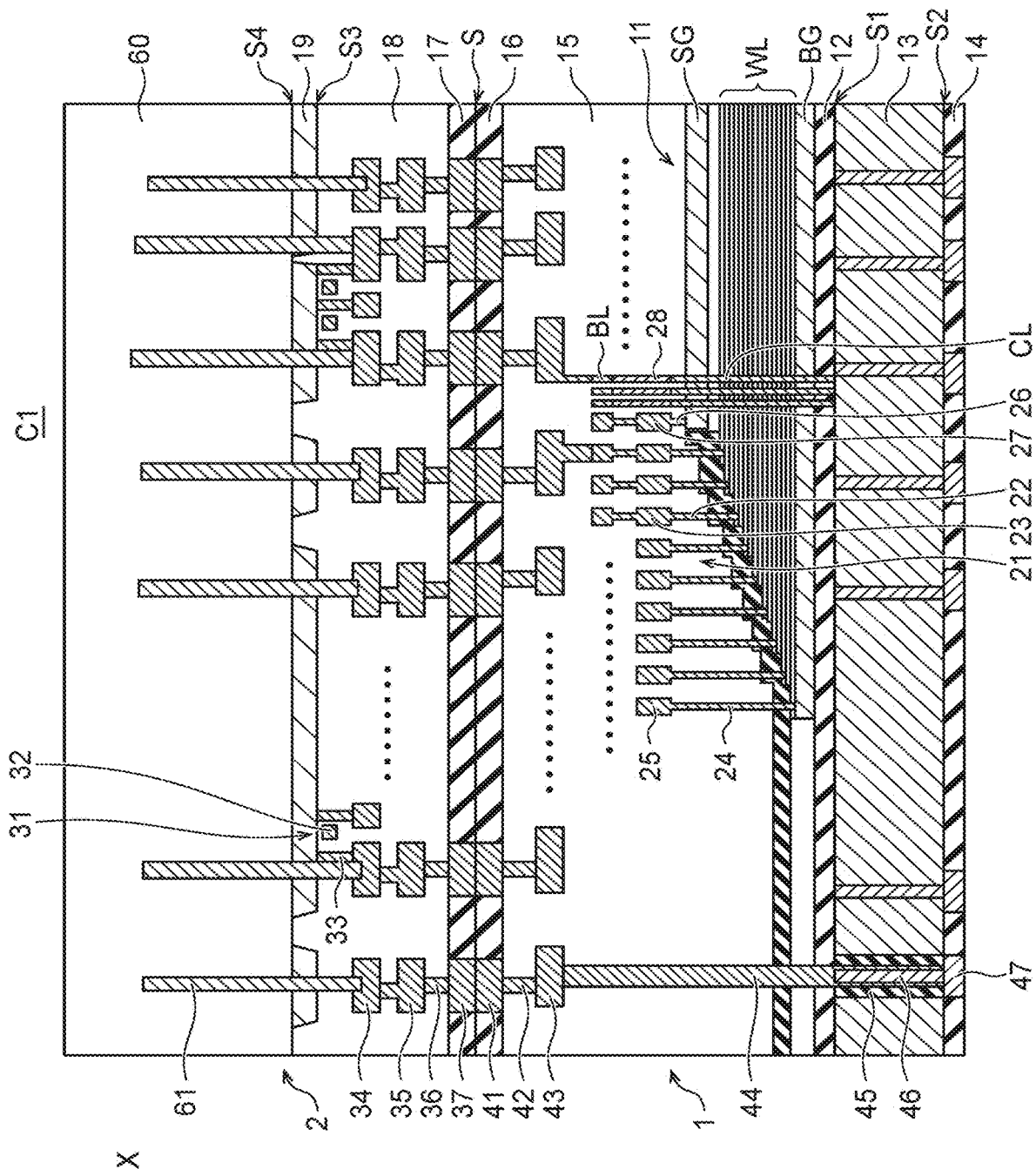
FIG. 13 is a view for illustrating a chip included in the semiconductor memory device illustrated in FIG. 1.

Next, the chip C1 will be further described with reference to FIG. 13. FIG. 13 is a cross-sectional view of the chip C1, and is a cross-sectional view of the state described with reference to FIG. 2. As illustrated in FIG. 13, the chip C1 is a three-dimensional memory including an array chip 1 and a circuit chip 2 bonded together.

The array chip 1 includes a memory cell array 11, an insulating film 12, a substrate 13, and an insulating film 14. The memory cell array 11 includes a plurality of memory cells. The insulating film 12 is provided below the memory cell array 11. The substrate 13 is provided below the insulating film 12. The insulating film 14 is provided below the substrate 13.

The array chip 1 further includes an interlayer dielectric 15 and an insulating film 16. The interlayer dielectric 15 is provided above the memory cell array 11. The insulating film 16 is provided above the interlayer dielectric 15. The insulating films 12, 14, and 16 are silicon oxide films or silicon nitride films, for example. The substrate 13 is a semiconductor substrate, such as a silicon substrate, for example.

The circuit chip 2 is provided above the array chip 1. Reference sign S indicates the bonded face of the array chip 1 and the circuit chip 2. The array chip 1 and the circuit chip 2 are bonded together after having been formed individually. The circuit chip 2 includes an insulating film 17, an interlayer dielectric 18, and a semiconductor 19. The interlayer dielectric 18 is provided above the insulating film 17. The semiconductor 19 is provided above the interlayer dielectric 18. The insulating film 17 is a silicon oxide film or a silicon nitride film, for example.

FIG. 13 illustrates the X-direction and the Y-direction that are parallel with the surfaces S1 and S2 of the substrate 13, the surface S3 of the semiconductor 19, and the surface S4 of a substrate 60, and are perpendicular to each other, and also illustrates the Z-direction perpendicular to the surfaces S1 and S2 and the surfaces S3 and S4. In this specification, the +Z-direction is handled as the upward direction, and the Z-direction is handled as the downward direction. For example, the memory cell array 11 is located below the substrate 60 and above the substrate 13. The Z-direction may either coincide with or not coincide with the direction of gravity.

The array chip 1 includes, as electrode layers in the memory cell array 11, a plurality of word lines WL, a back gate BG, and a selection gate SG. FIG. 13 illustrates a stepped structure portion 21 of the memory cell array 11. The array chip 1 and the circuit chip 2 are joined.

As illustrated in FIG. 13, each word line WL is electrically connected to a word wire layer 23 via a contact plug 22. The back gate BG is electrically connected to a back gate wire layer 25 via a contact plug 24. The selection gate SG is electrically connected to a selection gate wire layer 27 via a contact plug 26. Columnar portions CL are provided so as to penetrate the selection gate SG. The word lines WL, the back gate BG, and the columnar portions CL are electrically connected to bit lines BL via plugs 28, and are also electrically connected to the substrate 13.

The circuit chip 2 includes a plurality of transistors 31. Each transistor 31 includes a gate electrode 32, a source diffusion layer (not illustrated), and a drain diffusion layer (not illustrated). The gate electrode 32 is provided on the semiconductor 19 with a gate insulating film (not illustrated) interposed therebetween. The source diffusion layer and the drain diffusion layer are provided in the semiconductor 19.

The circuit chip 2 further includes plugs 33, wire layers 34, and wire layers 35. The plurality of plugs 33 are provided on the source diffusion layers or the drain diffusion layers of the respective transistors 31. The plurality of the wire layers 34 are provided on the respective plugs 33, and include a plurality of wires. The plurality of wire layers 35 are provided on the respective wire layers 34, and include a plurality of wires.

The circuit chip 2 further includes via plugs 36 and metal pads 37. The plurality of via plugs 36 are provided on the respective wire layers 35. The plurality of metal pads 37 are provided in the insulating film 17 and on the respective via plugs 36.

The circuit chip 2 further includes the substrate 60 and through-silicon vias 61. The substrate 60 is provided on the surface S4 of the semiconductor 19. The substrate 60 is a semiconductor substrate, such as a silicon oxide film or silicon, for example. The through-silicon vias 61 are provided in the interlayer dielectric 18, the semiconductor 19, and the substrate 60, and are provided on the respective wire layers 34. The substrate 60 corresponds to the silicon C1a in FIG. 2, for example. The through-silicon vias 61 correspond to the through-silicon vias T1 in FIG. 2, for example. The through-silicon vias 61 are formed so as to be buried in the substrate 60 before the wire layers 34 are formed, for example. The circuit chip 2 includes a CMOS control circuit (i.e., a logic circuit) for controlling the array chip 1.

The array chip 1 includes metal pads 41, via plugs 42, and wire layers 43. The plurality of metal pads 41 are provided in the insulating film 16 and on the respective metal pads 37. The plurality of via plugs 42 are provided on the respective metal pads 41. The plurality of wire layers 43 are provided on the respective via plugs 42, and include a plurality of wires. Each word line WL and each bit line BL are electrically connected to the corresponding wire in the wire layer 43.

The array chip 1 further includes a plug 44, plugs 46, and metal pads 47. The plug 44 is provided in the interlayer dielectric 15 and the insulating film 12, and is provided on the wire layer 43. The plug 46 is provided in the substrate 13 and the insulating film 14 with an insulating film 45 interposed therebetween, and is provided on the plug 44. The metal pad 47 is provided in the insulating film 14, and is provided on the plug 46. The metal pad 47 is provided flush with the lower face of the insulating film 14. The metal pad 47 is an external connection pad of the chip C1.

Figure 14:
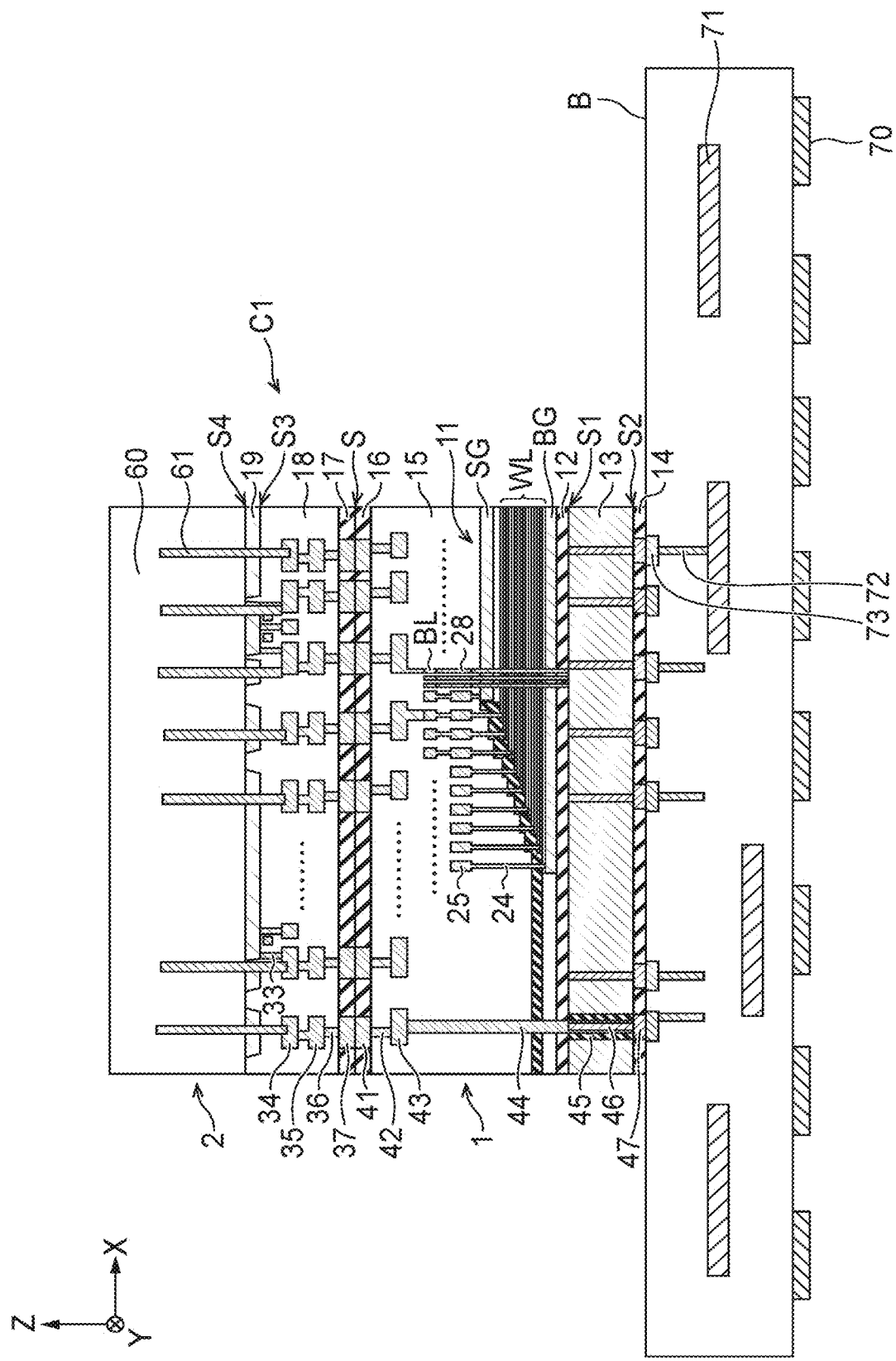
FIG. 14 is a view for illustrating a state in which the chip illustrated in FIG. 13 is joined to a base substrate.

FIG. 14 is a cross-sectional view illustrating a state in which the chip C1 is joined to the base substrate B by bonding. The base substrate B includes external terminals 70, wire layers 71, plugs 72, and metal pads 73. The plurality of external terminals 70 are provided below the base substrate B. The external terminals 70 are metal terminals for connection to the outside, and serve a similar role to the metal balls BE described with reference to FIG. 1.

The wire layers 71 are provided in the base substrate B, and include a plurality of wires. The plug 72 is provided in the base substrate B, and is provided on the wire layer 71. The metal pad 73 is provided on the plug 72. The metal pad 73 is provided in the base substrate B, and is provided flush with the upper face of the base substrate B.

The metal pads 47 of the chip C1 and the metal pads 73 of the base substrate B at corresponding positions are arranged opposite each other, and are joined together by bonding.

Figure 15:
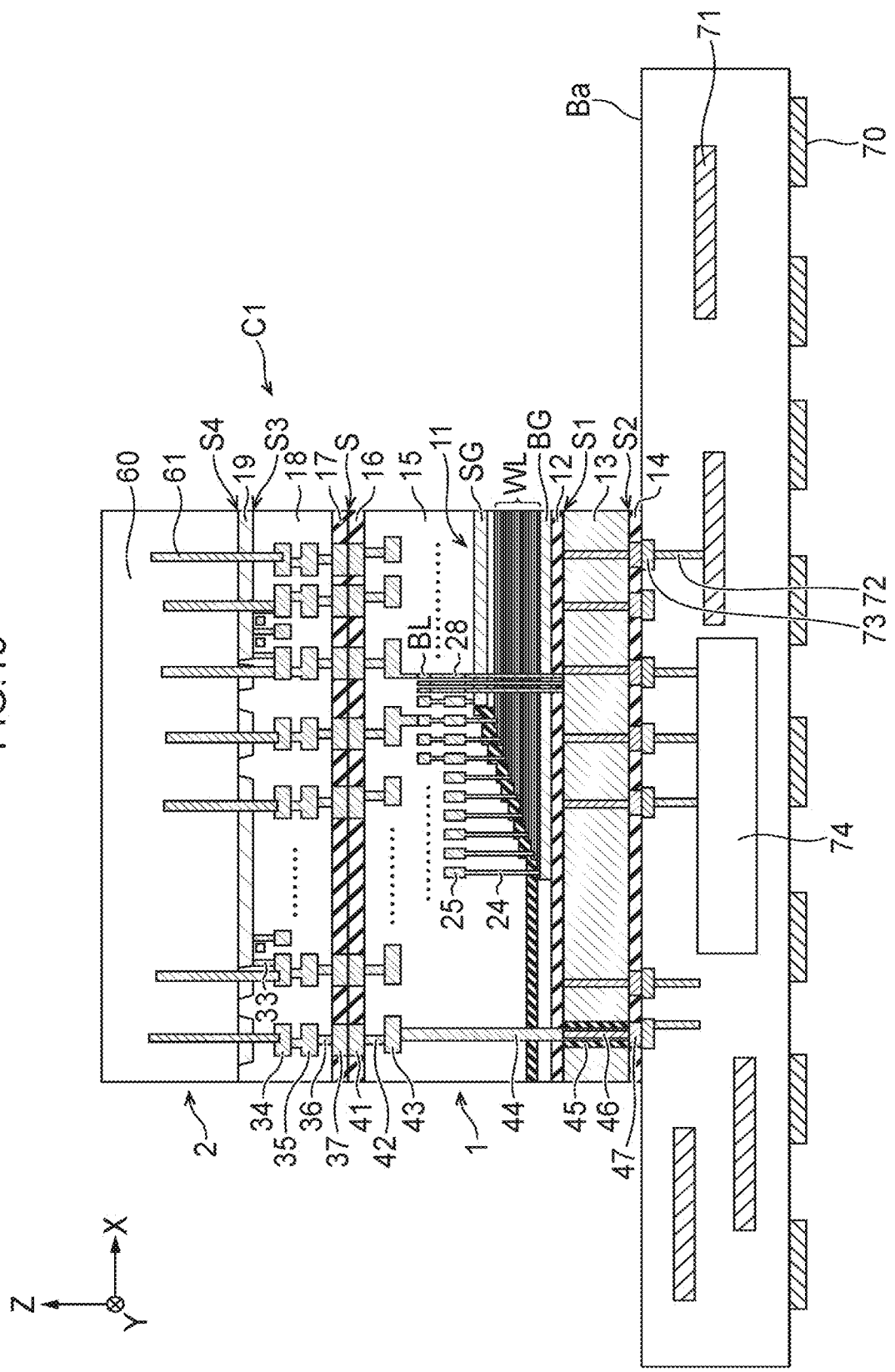
FIG. 15 is a view for illustrating a modified example of the base substrate illustrated in FIG. 14.

A controller may be provided in the base substrate. FIG. 15 illustrates an example of a base substrate Ba in which a controller 74 is provided. The controller 74 is a controller for controlling the chip C1, for example. The controller 74 and the metal pads 73 are connected via the plugs 72.

Figure 16:
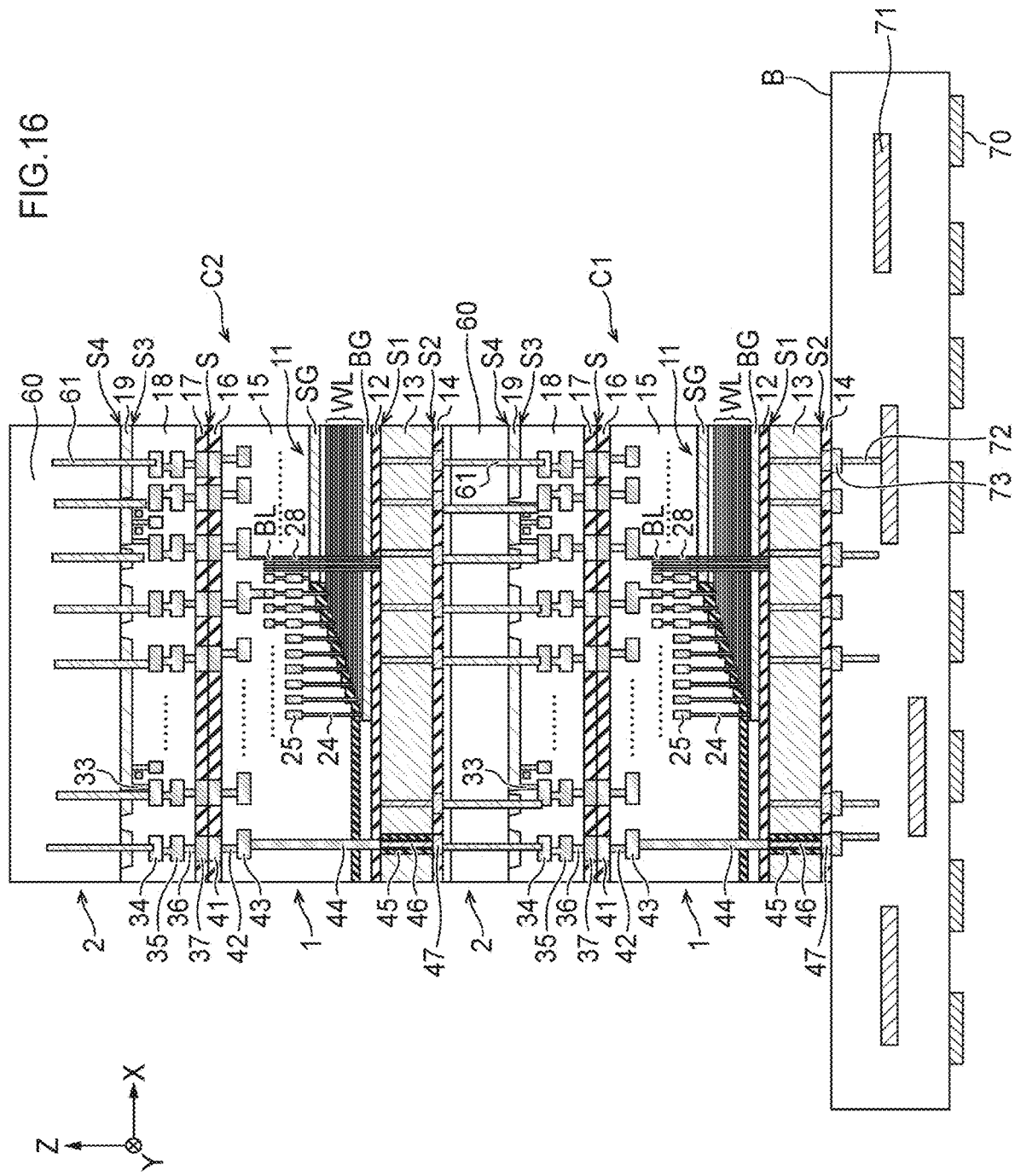
FIG. 16 is a view for illustrating a state in which another chip is further joined to the chip illustrated in FIG. 14.

FIG. 16 is a cross-sectional view illustrating a state in which the chip C2 is further joined to the chip C1 illustrated in FIG. 14 by bonding. In the state illustrated in FIG. 14, the top portions of the through-silicon vias 61 of the chip C1 are exposed using the method described with reference to FIGS. 3 to 9, and then, the chip C2 is put on the chip C1. The through-silicon vias 61 of the chip C1 and the metal pads 47 of the chip C2 at corresponding positions are arranged opposite each other, and are joined by bonding. A face of the chip C2 on the side of the chip C1 is formed of an insulating film, such as a silicon oxide film, for example, and may be formed flush with the pads 47. A face of the chip C1 on the side of the chip C2 is formed of an insulating film, such as a silicon oxide film, for example, and may be formed flush with the through-silicon vias 61.

Figure 17:
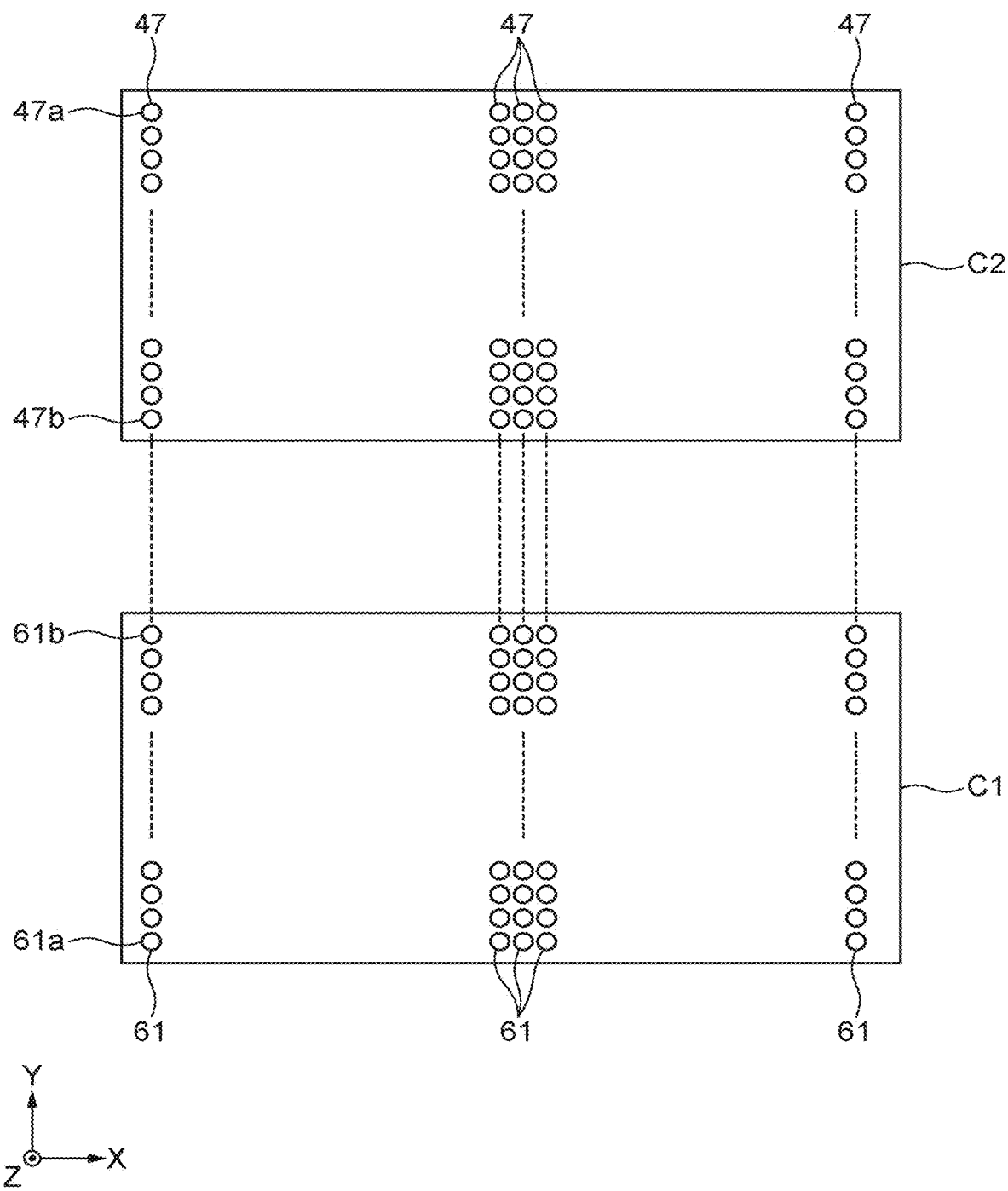
FIG. 17 is a view for illustrating a state in which a chip is joined to another chip.

As illustrated in FIG. 17, an example in which the through-silicon vias 61 of the chip C1 and the metal pads 47 of the chip C2 are arranged will be described. FIG. 17 illustrates the upper face of the chip C1 and the lower face of the chip C2. In the example illustrated in FIG. 17, through-silicon vias 61a correspond to metal pads 47a, and through-silicon vias 61b correspond to metal pads 47b. The chip C2 is put on the chip C1 and is bonded thereto so that corresponding vias and pads are arranged opposite each other.

Figure 18:
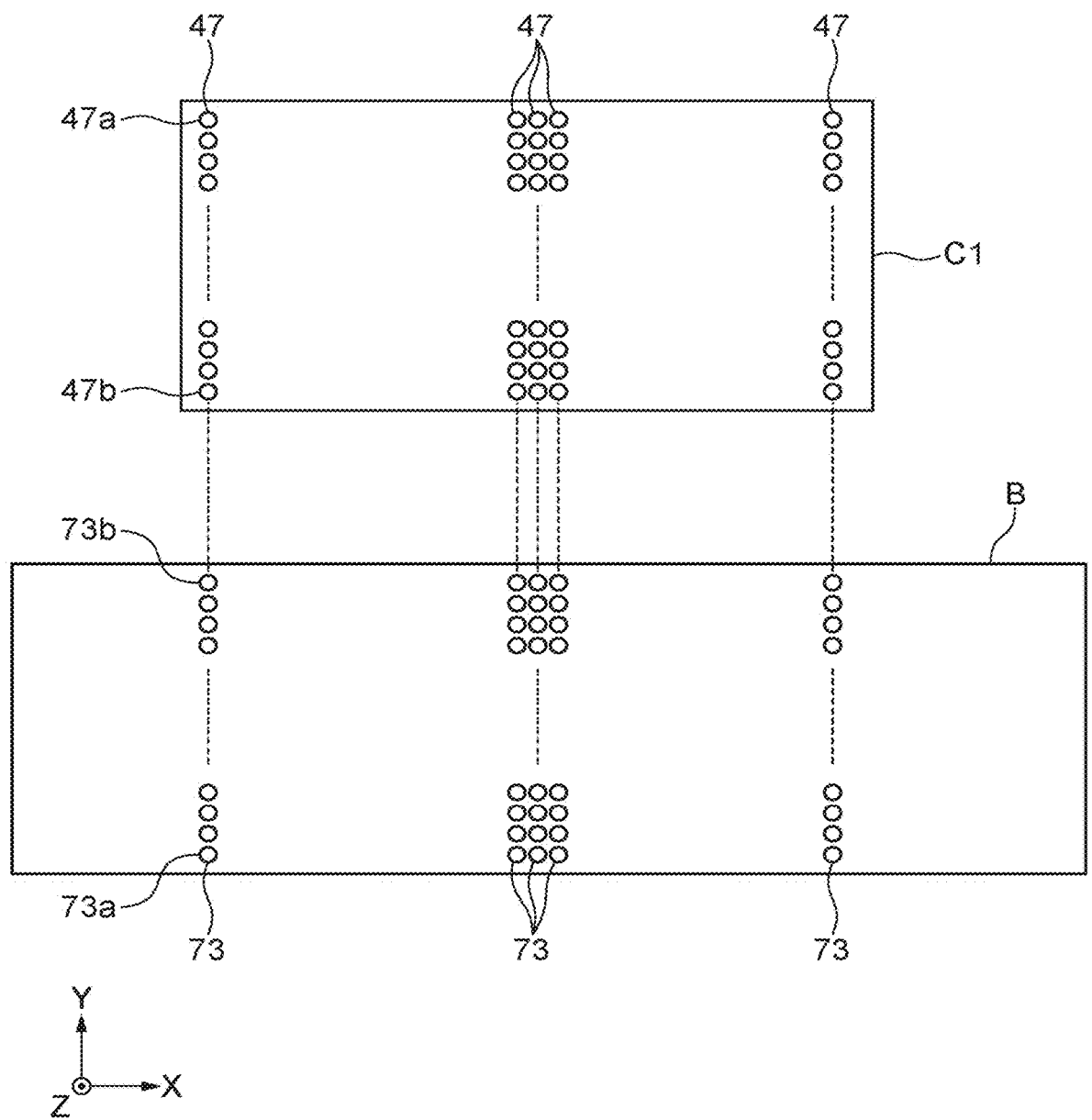
FIG. 18 is a view for illustrating a state in which a chip is joined to a substrate.

In FIG. 18, a case where the chip C1 is joined to the base substrate B will be described. FIG. 18 illustrates the upper face of the base substrate B and the lower face of the chip C1. In the example illustrated in FIG. 18, metal pads 73a correspond to metal pads 47a, and metal pads 73b correspond to metal pads 47b. The chip C1 is put on the base substrate B and is bonded thereto so that corresponding pads are arranged opposite each other.

Although FIG. 18 illustrates an example in which the metal pads 73 are arranged linearly along the short side of the base substrate B and the metal pads 47 are also arranged linearly along the short side of the chip C1, the arrangement patterns of the metal pads 73 and the metal pads 47 are not limited thereto.

Figure 19:
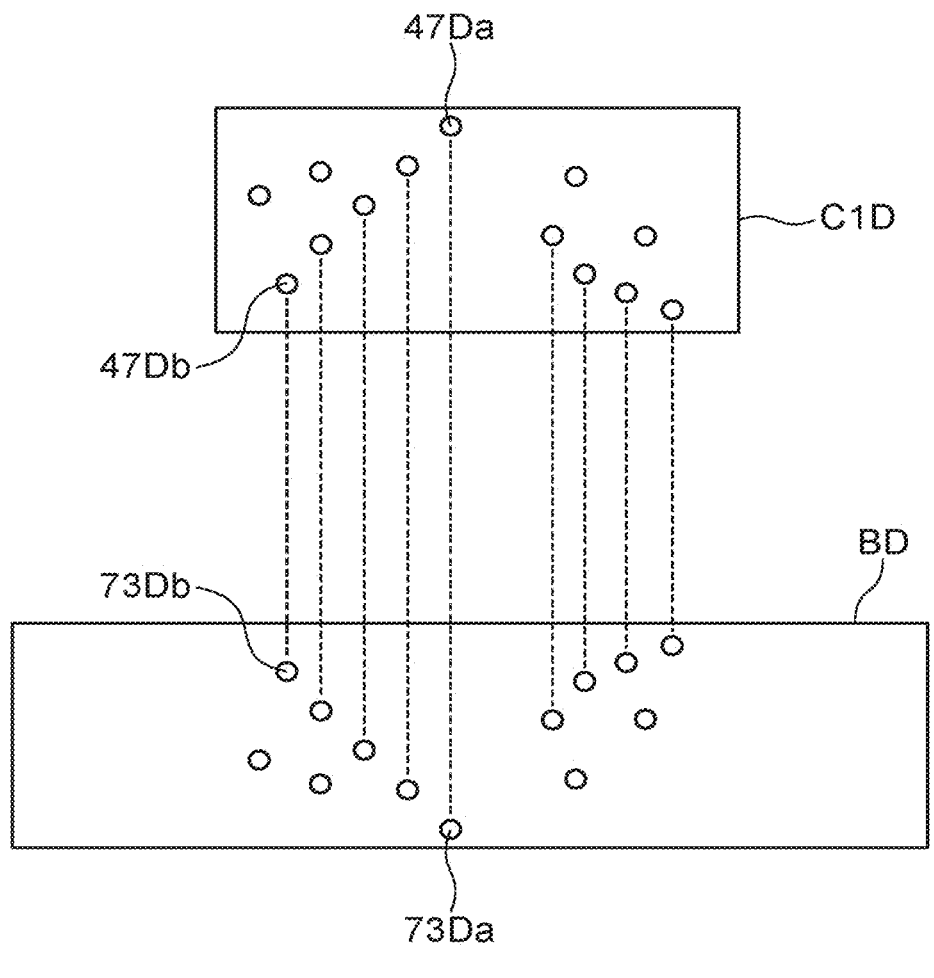
FIG. 19 is a view for illustrating a state in which a chip is joined to a substrate.

As illustrated in FIG. 19, the metal pads may be arranged in an irregular pattern. FIG. 19 illustrates the upper face of a base substrate BD and the lower face of a chip C1D. In the example illustrated in FIG. 19, a metal pad 73Da corresponds to a metal pad 47Da, and a metal pad 73Db corresponds to a metal pad 47Db. The chip C1D is put on the base substrate BD and is bonded thereto so that corresponding pads are arranged opposite each other. It should be noted that as illustrated in the example of FIG. 19, the arrangement pattern of the metal pads in the chip C1D may be changed according to the arrangement pattern of the metal pads in the base substrate BD, or it is also possible to perform rewiring while using the arrangement pattern of the metal pads in the chip C1 illustrated in the example of FIG. 18.

Figure 20:
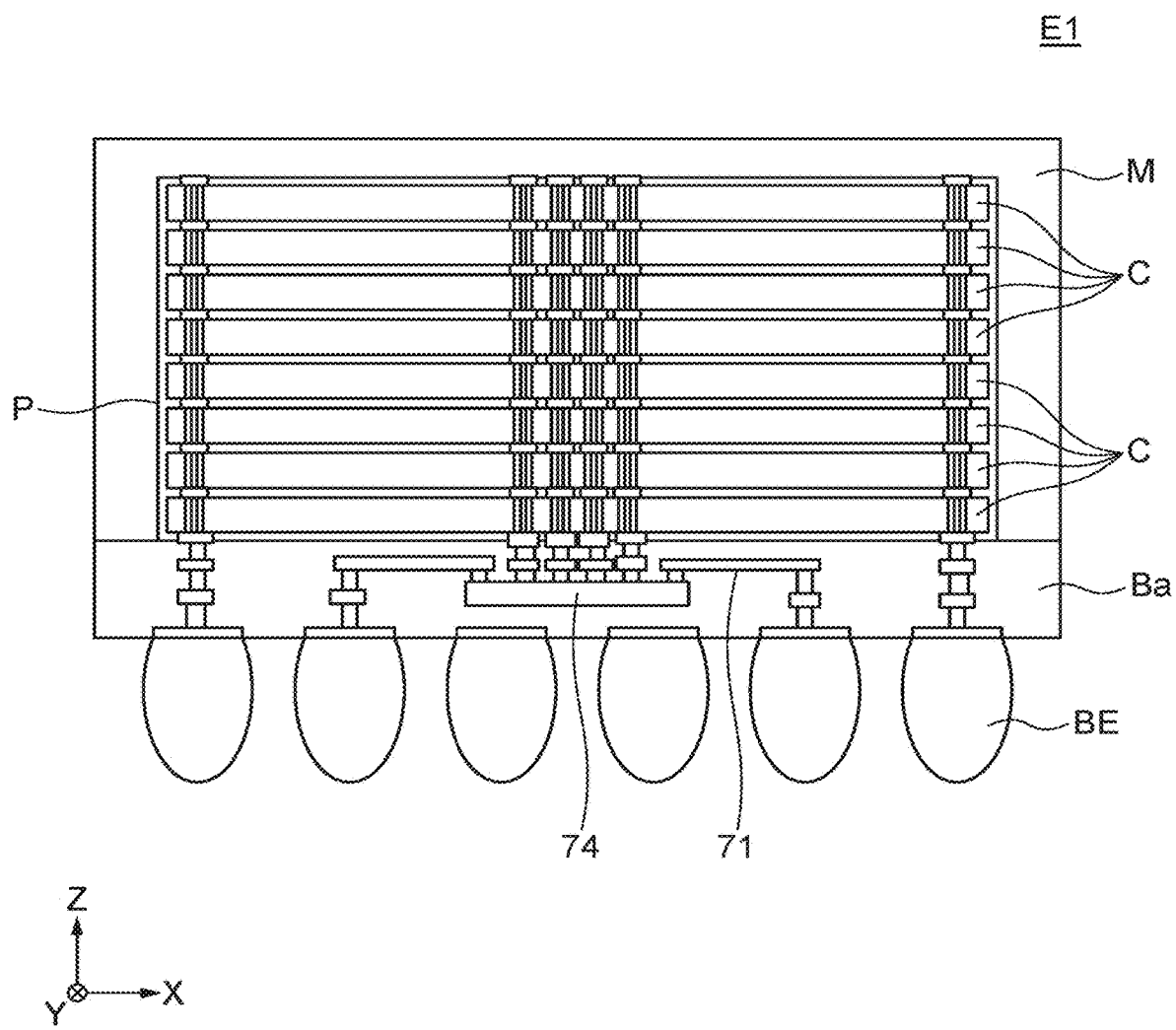
FIG. 20 is a view for illustrating the configuration of a semiconductor memory device according to a modified example.

FIG. 20 is a view for illustrating a semiconductor memory device E1 for which the base substrate Ba described with reference to FIG. 15 is used. As illustrated in FIG. 20, the base substrate Ba includes the controller 74. The wire layers 71 are provided in the base substrate Ba. Chips C are stacked on the base substrate Ba. Each chip C is not limited to the one obtained by joining a memory board and a CMOS (Complementary Metal-oxide Semiconductor) like the chip C1 described with reference to FIG. 13 and the like, and may include only a memory board, for example. A protective film P is provided on the outer periphery of the plurality of stacked chips C. A molding resin layer M is provided around the protective film P.

Figure 21:
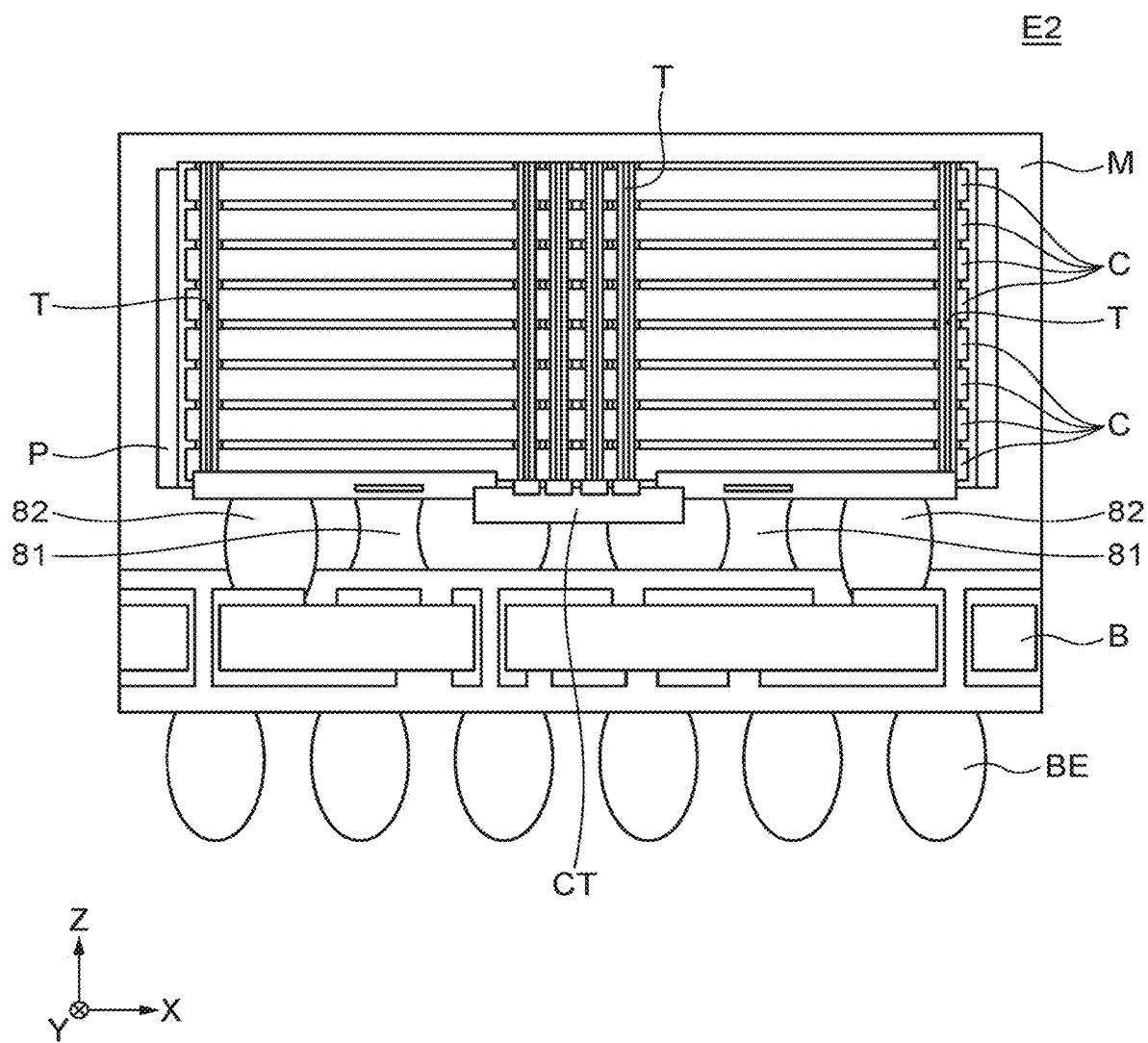
FIG. 21 is a view for illustrating the configuration of a semiconductor memory device according to a second embodiment.

FIG. 21 is a cross-sectional view for illustrating the structure of a semiconductor memory device E2 according to a second embodiment. The semiconductor memory device E2 includes a base substrate B and a plurality of chips C. The chips C are held on the base substrate B while being supported by bonding portions 81. The base substrate B and the chips C are electrically connected via connection electrodes 82. A plurality of metal balls BE are joined to a face of the base substrate B on the side opposite to a face to which the chips C are joined.

Each of the plurality of chips C is provided with through-silicon vias T. A protective film P is provided so as to cover the side faces of the plurality of chips C. The protective film P may also be removed. A molding resin layer M is provided so as to cover the protective film P.

Next, a method for producing the semiconductor memory device E2 will be described with reference to FIGS. 22 to 31. FIGS. 22 to 31 illustrate an example in which two chips C are mounted.

As illustrated in FIG. 22, a support substrate SB is prepared. The support substrate SB is a substrate to be removed during the production process.

Next, as illustrated in FIG. 23, a chip C is joined to the support substrate SB using an adhesive, for example. Through-silicon vias T are provided in the chip C.

Next, as illustrated in FIG. 24, a protective film P is provided on the chip C joined to the support substrate SB, and the top portions of the through-silicon vias T are exposed so that a next chip C is joined thereto. The through-silicon vias T of the two chips C, which are joined, are joined. The two chips C are joined by bonding.

Figure 25:
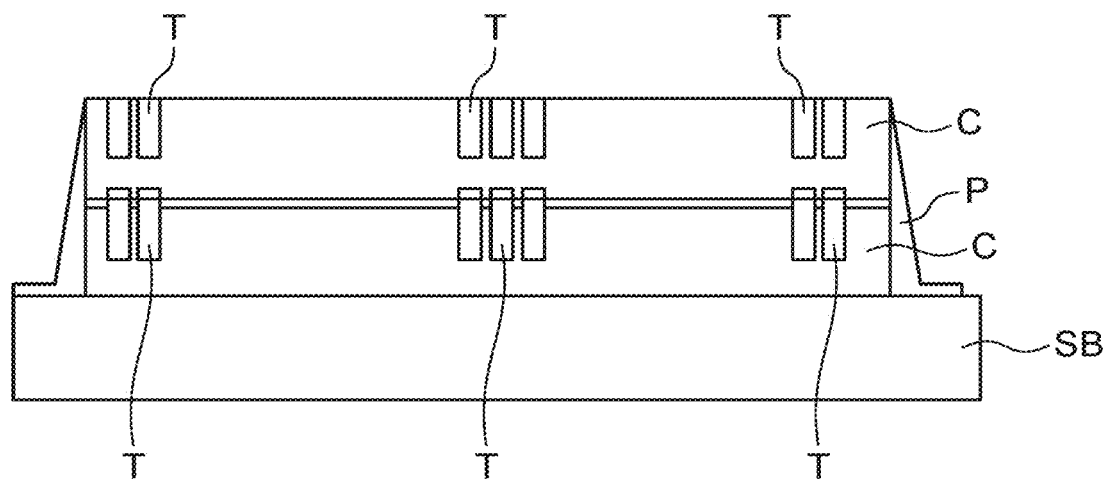
FIG. 25 is a view for illustrating a method for producing the semiconductor memory device illustrated in FIG. 21.

Next, as illustrated in FIG. 25, a protective film P is provided on the upper chip C, and the top portions of the through-silicon vias T are exposed.

Next, as illustrated in FIG. 26, a control chip CT is connected to the upper chip C. The control chip CT is joined to the through-silicon vias T of the upper chip C.

Figure 27:
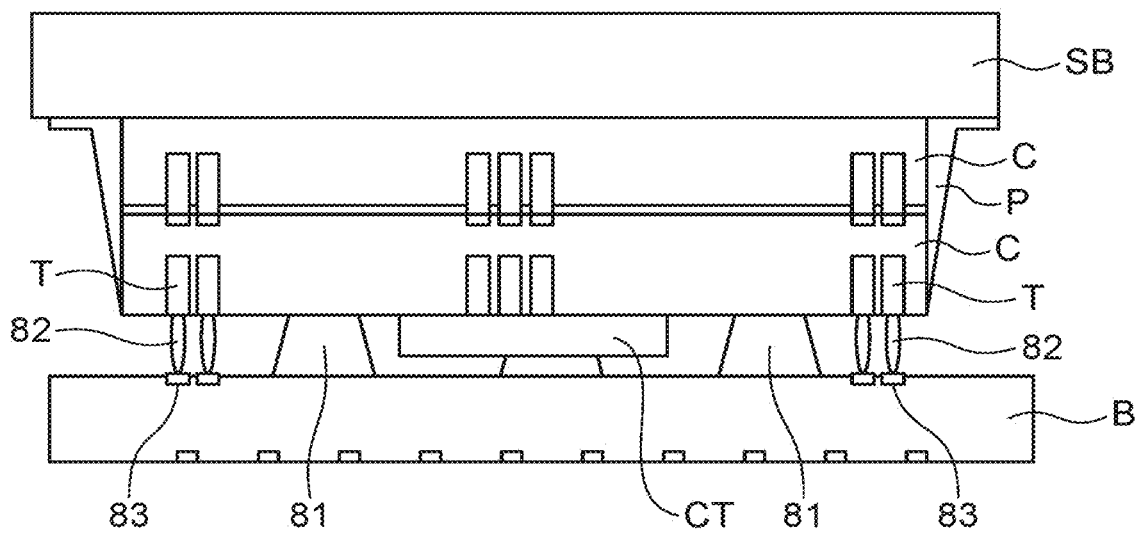
FIG. 27 is a view for illustrating a method for producing the semiconductor memory device illustrated in FIG. 21.

Next, as illustrated in FIG. 27, a base substrate B is prepared. The base substrate B includes wire layers (not illustrated). The base substrate B has metal pads 83 on its upper face. The support substrate SB and the chips C illustrated in FIG. 26 are flipped upside down, and are bonded to the base substrate B. The bonding is performed with bonding portions 81. The bonding portions 81 also serve as supports for holding the chips C on the base substrate B at predetermined intervals. The chips C and the base substrate B are electrically connected via electrodes 82. The electrodes 82 are connected to the through-silicon vias T and the metal pads 83.

Figure 28:
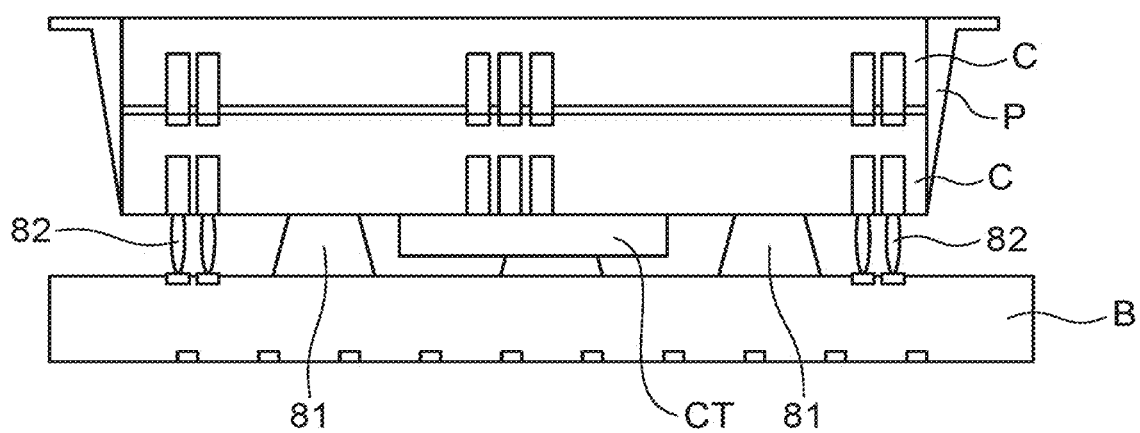
FIG. 28 is a view for illustrating a method for producing the semiconductor memory device illustrated in FIG. 21.
Figure 29:
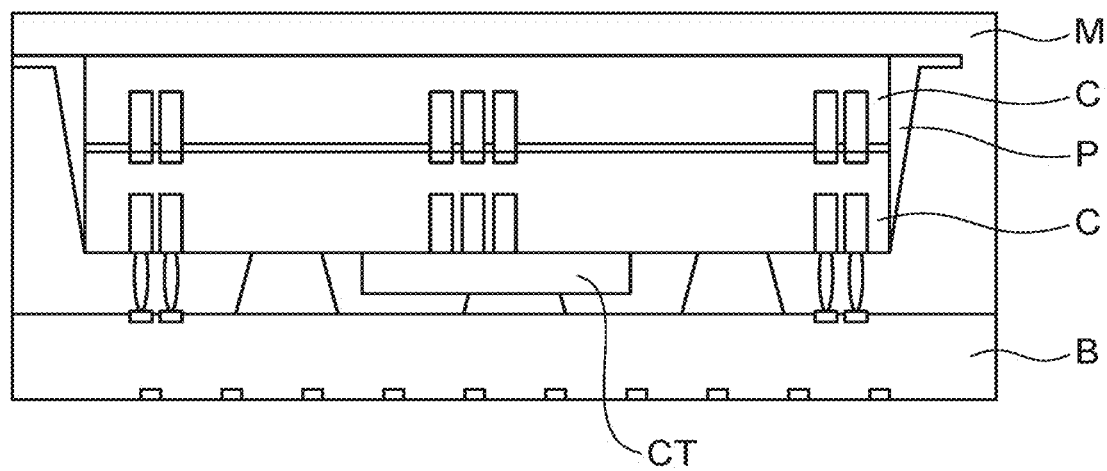
FIG. 29 is a view for illustrating a method for producing the semiconductor memory device illustrated in FIG. 21.

Next, as illustrated in FIG. 28, the support substrate SB is removed. Next, as illustrated in FIG. 29, molding resin is provided so as to cover the chips C on the base substrate B so that a molding resin layer M is formed.

Figure 30:
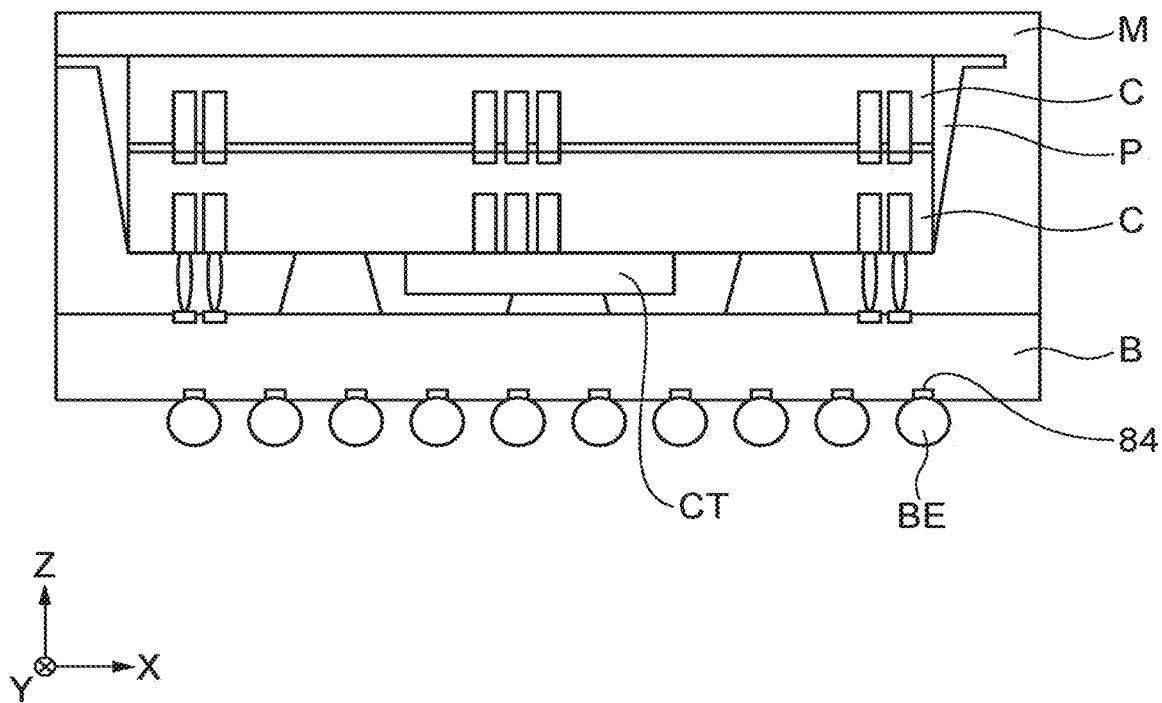
FIG. 30 is a view for illustrating a method for producing the semiconductor memory device illustrated in FIG. 21.
Figure 31:
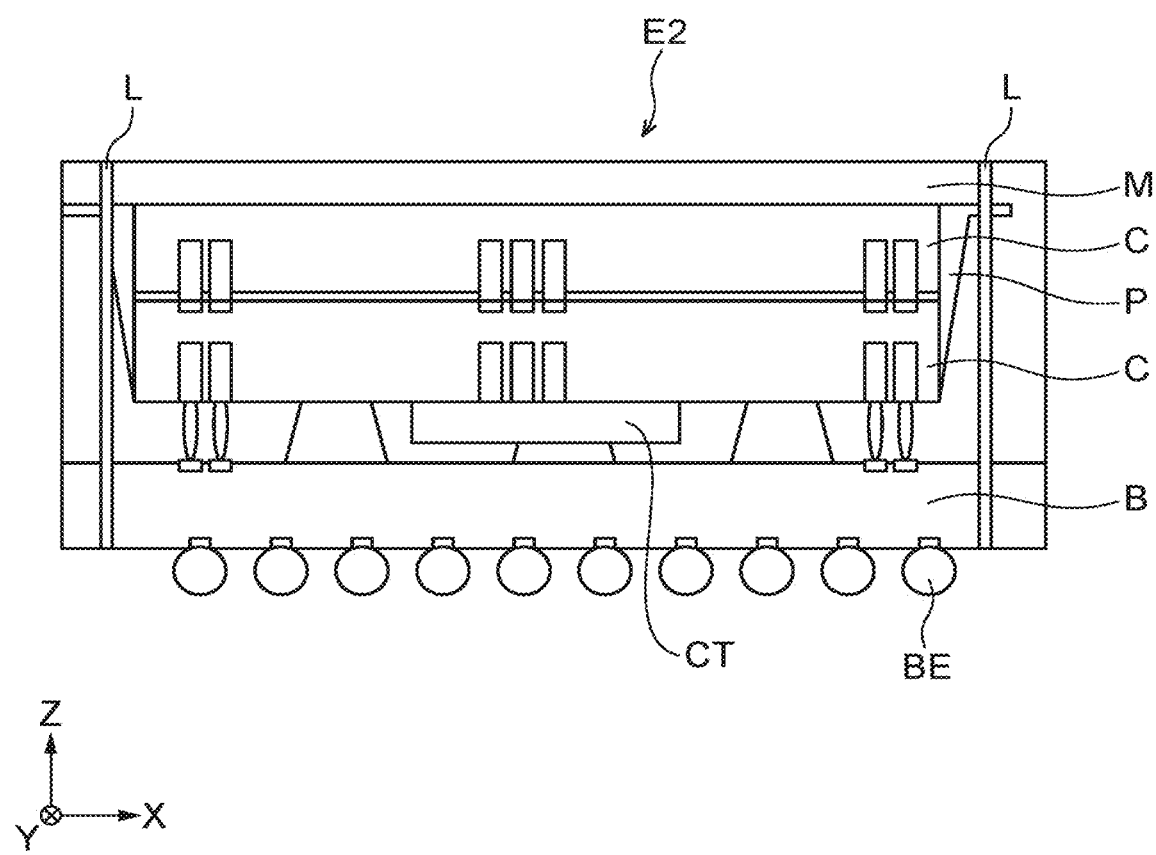
FIG. 31 is a view for illustrating a method for producing the semiconductor memory device illustrated in FIG. 21.

Next, as illustrated in FIG. 30, metal balls BE are joined to the lower face of the base substrate B. The metal balls BE are joined to the metal pads 83 provided on the lower face of the base substrate B. Next, as illustrated in FIG. 31, the structure is diced into individual pieces along cut lines L so that the semiconductor memory device E2 is obtained. At this time, the protective film P may be partially exposed from the side faces of the molding resin layer M. Unlike in the semiconductor device E of FIG. 1, the protective film P is exposed around the end portions of the chip C that is most distant from the base substrate B. The protective film P may be removed before the molding resin layer M is formed. In such a case, the protective film P is not exposed from the molding resin layer M.

The semiconductor device E, E1, or E2 of each of the aforementioned embodiments includes the base substrate B or Ba including wire layers, and the chips C or the chips C1, C2, C3, C4, C5, and C6 provided on the base substrate B or Ba, and also includes the protective film P provided on the side faces of the chips C or the chips C1, C2, C3, C4, C5, and C6. In a CMP step for making the chips C or the chips C1, C2, C3, C4, C5, and C6, which have been obtained through dicing, thinner and forming junction electrodes, even when the processing pressure of CMP concentrates on the chips, local polishing does not proceed because the protective film P of a SiN film, for example, remains on each of the side faces of the chips C or the chips C1, C2, C3, C4, C5, and C6. Thus, it is possible to suppress a roll-off phenomenon in which the ends of the chips C or the chips C1, C2, C3, C4, C5, and C6 become thin. This can improve the joining failures of the ends of the chips C or the chips C1, C2, C3, C4, C5, and C6.

The protective film P contains at least one of $SiO_2$, SiN, SiC, and BN. The thickness of the protective film P on the side of the base substrate B or Ba differs from that on the side of the upper end of the chips C or the chips C1, C2, C3, C4, C5, and C6.

The method for producing the semiconductor device E or E1 according to each of the aforementioned embodiments includes preparing the base substrate B or Ba including wire layers, joining the chips C or the chips C1, C2, C3, C4, C5, and C6 including electrodes to the base substrate B or Ba, forming the protective film P on the chips C or the chips C1, C2, C3, C4, C5, and C6, and exposing the top portions of the electrodes in the chips C or the chips C1, C2, C3, C4, C5, and C6. In a CMP step for making the chips C or the chips C1, C2, C3, C4, C5, and C6, which have been obtained through dicing, thinner and forming junction electrodes, even when the processing pressure of CMP concentrates on the chips, local polishing does not proceed because the protective film P of a SiN film, for example, remains on each of the side faces of the chips C or the chips C1, C2, C3, C4, C5, and C6. Thus, it is possible to suppress a roll-off phenomenon in which the ends of the chips C or the chips C1, C2, C3, C4, C5, and C6 become thin. This can improve the joining failures of the ends of the chips C or the chips C1, C2, C3, C4, C5, and C6.

The method for producing the semiconductor device E2 according to the aforementioned embodiment includes preparing the support substrate SB, bonding the chips C including electrodes to the support substrate SB, forming the protective film P on the chips C, exposing the top portions of the electrodes in the chips C, joining the base substrate B including wire layers to the side of the chips C opposite to the side bonded to the support substrate SB, and removing the support substrate SB. In a CMP step for making the chips C, which have been obtained through dicing, thinner and forming junction electrodes, even when the processing pressure of CMP concentrates on the chips, local polishing does not proceed because the protective film P of a SiN film, for example, remains on each of the side faces of the chips C. Thus, it is possible to suppress a roll-off phenomenon in which the ends of the chips C become thin. This can improve the joining failures of the ends of the chips C.

In the production method of each of the aforementioned embodiments, it is possible to, after forming the protective film P on the chips C or the chips C1, C2, C3, C4, C5, C6, make the chips C or the chips C1, C2, C3, C4, C5, and C6 thinner and expose the top portions of the electrodes in the chips C or the chips C1, C2, C3, C4, C5, and C6.

In the production method of each of the aforementioned embodiments, the protective film P can be formed to a thickness of 20 nm to 3000 nm. In the production method of each of the aforementioned embodiments, the protective film P contains at least one of SiN, SiC, and BN. The protective film P may also be a stacked film of at least one of SiN, SiC, and BN, and $SiO_2$.

OTHER EMBODIMENTS

When the protective film P is a stacked film, a stacked structure of SiN and $SiO_2$ may be repeated more than once, for example. In such a case, the number of repeated stacked structures on each side face of each of the chips C1, C2, C3, C4, C5, and C6 may be different.

In each of the semiconductor devices E and E1, the number of repeated stacked structures is the largest on each side face of the chip C1, and becomes sequentially smaller by one on each of the side faces of the chips C2 to C6. In the semiconductor device E2, the number of repeated stacked structures is the largest on each side face of the chip that is most distant from the base substrate B, and becomes sequentially smaller by one on each of the side faces of the chips closer to the base substrate B.

In FIG. 7, the oxide film C1b is formed on the side faces and the rear face of each chip C1 and on the base substrate B. However, at this time, the oxide film C1b may be formed only on the rear face of each chip C1, that is, on the silicon C1a. In such a case, since the oxide film C1b is not formed on the side faces of each chip C1 or the base substrate B, the protective film P does not have the aforementioned repeated structures of stacked films, and is formed only of SiN, for example. However, more specifically, a plurality of SiN layers are formed.

In FIG. 28, the support substrate SB is removed, but the support substrate SB need not be removed. In such a case, the support substrate SB on the upper face of the semiconductor device E2 may be used as is. Alternatively, when the entire support substrate SB is buried in the molding resin layer M, cross-sections of the support substrate SB are exposed from the side faces of the molding resin layer M.

Although the present embodiment has been described with reference to specific examples, the present disclosure is not limited thereto. Such specific examples are, even when some design changes are appropriately made thereto by one of ordinary skill in the art, also included in the scope of the present disclosure as long as the resulting design includes the features of the present disclosure. The components, their arrangement, conditions, shapes, and the like of each of the aforementioned specific examples are not limited to those exemplarily illustrated above, and can be changed as appropriate. A combination of the components of each of the aforementioned specific examples can be changed as appropriate unless any technical contradiction occurs.

What is claimed is:

1. A semiconductor device comprising:
   a base substrate including a wire layer;
   a first chip provided on the base substrate;
   a second chip provided on the first chip;
   an insulating film provided on a side face of the first chip and a side face of the second chip; and
   a resin layer covering the second chip and the insulating film,
   wherein the insulating film is a stacked film of a protective film and a first oxide film, and
   wherein the number of layers of the protective film on the side face of the first chip is greater than the number of layers of the protective film on the side face of the second chip.

2. The semiconductor device according to claim 1, wherein the insulating film contains at least one of silicon oxide, silicon nitride, silicon carbide, boron nitride, and diamond-like carbon.

3. The semiconductor device according to claim 1, wherein the insulating film is thicker at a portion along a direction perpendicular to the side face of the first chip than at a portion along a direction perpendicular to the side face of the second chip.

4. The semiconductor device according to claim 1, further comprising a second oxide film provided on a face of the first chip on a side opposite to the base substrate,
   wherein:
   the second oxide film is thinner around peripheral edge portions of the first chip than around a central portion of the first chip.

5. The semiconductor device according to claim 4, wherein an upper end portion of the protective film on the side face of the first chip is exposed from the first oxide film and the second oxide film.

6. The semiconductor device according to claim 5, wherein the upper end portion of the protective film on the side face of the first chip is located between the first oxide film and the second oxide film.

* * * * *